United States Patent
Wee et al.

(10) Patent No.: US 8,625,290 B2
(45) Date of Patent: Jan. 7, 2014

(54) WATERPROOF STRUCTURE FOR PORTABLE TERMINAL

(75) Inventors: Jong-Cheon Wee, Gyeonggi-do (KR); Jae-Shik Kim, Gyeonggi-do (KR); Seung-Hyub Baek, Gyeonggi-do (KR); Wook-Jin Lee, Gyeonggi-do (KR); Hyon-Myong Song, Gyeonggi-do (KR); Jin-Yong Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 526 days.

(21) Appl. No.: 12/885,797

(22) Filed: Sep. 20, 2010

(65) Prior Publication Data

US 2011/0090652 A1    Apr. 21, 2011

(30) Foreign Application Priority Data

Oct. 15, 2009  (KR) .................. 10-2009-0098146
Jan. 26, 2010  (KR) .................. 10-2010-0007163
May 12, 2010  (KR) .................. 10-2010-0044351

(51) Int. Cl.
| H01B 17/58 | (2006.01) |
| H01B 17/30 | (2006.01) |
| H01B 17/26 | (2006.01) |
| H05K 5/00 | (2006.01) |

(52) U.S. Cl.
USPC .................. 361/752; 174/152 R; 174/152 G

(58) Field of Classification Search
USPC .................. 174/152 R, 152 G; 361/752
See application file for complete search history.

(56) References Cited

U.S. PATENT DOCUMENTS

| 4,227,043 | A | * | 10/1980 | Stohr et al. ................ 174/151 |
| 5,358,429 | A | * | 10/1994 | Mina ........................ 439/695 |
| 6,064,003 | A | * | 5/2000 | Moore et al. .............. 174/662 |
| 6,402,155 | B2 | * | 6/2002 | Sakata ...................... 277/314 |
| 6,521,989 | B2 | * | 2/2003 | Zhou ......................... 257/698 |
| 6,709,253 | B2 | * | 3/2004 | Hattori et al. ............. 425/116 |
| 6,787,701 | B2 | * | 9/2004 | Yasuda et al. ............ 174/664 |
| 6,857,884 | B2 | * | 2/2005 | Kim et al. ................. 439/137 |
| 7,251,512 | B2 | * | 7/2007 | Komiyama ............. 455/575.3 |
| 7,757,384 | B2 | * | 7/2010 | MacAuley et al. ......... 29/745 |
| 7,789,696 | B2 | * | 9/2010 | Umei et al. ............... 439/447 |
| 8,106,312 | B2 | * | 1/2012 | Shinoda et al. ........... 174/554 |

(Continued)

FOREIGN PATENT DOCUMENTS

| JP | 09-078907 A | 3/1997 |
| JP | 2004-047968 A | 2/2004 |

(Continued)

*Primary Examiner* — Timothy Thompson
*Assistant Examiner* — Nathan Milakovich
(74) *Attorney, Agent, or Firm* — Cha & Reiter, LLC

(57) ABSTRACT

A waterproof structure for a portable terminal including a flexible printed circuit (FPC) extending outside of a first housing of a pair of housings from inside the first housing and arranged inside of a second housing of the pair of housings. A wiring hole is formed in each housing to provide a path allowing passage of the FPC therethrough. A waterproof member provided in the wiring hole substantially contacts at least inner walls of the housings and an outer circumferential surface of the FPC to prevent movement of the FPC. An outer circumferential surface of the waterproof member substantially contacts a circumference of an inlet of the wiring hole or an inner wall of the wiring hole. The waterproof member is provided between the housing of the portable terminal and the FPC improving a waterproof function and preventing moisture or water from being introduced into the housing of the terminal.

21 Claims, 21 Drawing Sheets

(56) References Cited

U.S. PATENT DOCUMENTS

| | | |
|---|---|---|
| 2002/0079653 A1* | 6/2002 | Noguchi et al. .............. 277/628 |
| 2006/0082157 A1* | 4/2006 | Czuhanich et al. ........... 285/420 |
| 2008/0015000 A1* | 1/2008 | Jung ........................... 455/575.1 |
| 2009/0020962 A1* | 1/2009 | Shinoda et al. .............. 277/650 |
| 2009/0086444 A1* | 4/2009 | Yoshikawa et al. ............ 361/752 |
| 2009/0302034 A1* | 12/2009 | Makela et al. ................. 220/3.8 |
| 2010/0118498 A1* | 5/2010 | Ren ............................... 361/749 |
| 2010/0195275 A1* | 8/2010 | Kim et al. ............... 361/679.01 |
| 2010/0195296 A1* | 8/2010 | Nishiwaki .................... 361/752 |
| 2011/0000712 A1* | 1/2011 | Kasuga et al. ................ 174/650 |
| 2011/0051383 A1* | 3/2011 | Chen et al. .................... 361/752 |
| 2011/0180319 A1* | 7/2011 | Nagata et al. ................. 174/668 |
| 2012/0327617 A1* | 12/2012 | Maeyama ..................... 361/752 |

FOREIGN PATENT DOCUMENTS

| | | |
|---|---|---|
| KR | 10-1998-0072126 A | 10/1998 |
| KR | 2002-0053023 A | 7/2002 |
| KR | 10-0758840 B1 | 9/2007 |
| KR | 10-2009-0009088 A | 1/2009 |

\* cited by examiner

WATERPROOF STRUCTURE FOR PORTABLE TERMINAL

CLAIM OF PRIORITY

This application claims the benefit of priority under 35 U.S.C. §119(a) from a Korean Patent Application filed on Oct. 15, 2009 and assigned Serial No. 10-2009-0098146, a Korean Patent Application filed on Jan. 26, 2010 and assigned Serial No. 10-2010-0007163, and a Korean Patent Application filed May 12, 2010 and assigned Serial No. 10-2010-044351, the entire disclosures of all the aforementioned documents are hereby incorporated by reference in their entirety.

BACKGROUND OF THE INVENTION

1. Field of the Invention

The present invention relates to a portable terminal. More particularly, the present invention relates to a waterproof structure in a portable terminal including a pair of housings provided in wiring for interconnecting circuit devices installed in the housings.

2. Description of the Related Art

Generally, a "portable terminal" refers to an apparatus carried with a user to perform communication with another user or a mobile communication service provider. The term "portable terminal" also refers to an apparatus providing a particular function, such as outputting an electronic note, providing a portable game console, or a multimedia player, etc., in addition a communication apparatus for providing the aforementioned mobile communication functions.

Based on their outward appearance, such portable terminals can be classified into, for example, bar-type terminals, flip-type terminals, folder-type terminals, and sliding-type terminals.

The bar-type terminal typically has a simple structure in which input/output devices are mounted in a single housing. Recently, there has emerged a terminal structured such that a keypad and a display device are implemented with a touch screen, and transmitting and receiving units are disposed at both sides of the touch screen, respectively. Such bar-type terminals permit both a communication function and a multimedia function to be used in a single terminal with ease.

The flip-type terminal is structured such that a flip for opening or closing an input device, such as a keypad installed on a bar-type terminal, thereby preventing malfunction of the input device. As input/output devices become implementable with a touch screen, the flip-type terminal is gradually disappearing from the market.

The folder-type or sliding-type terminal can be carried with a pair of housings overlapping each other, and can be opened or closed by folding/unfolding one of the housings by rotation relative to the other or by sliding the housing relative to the other. The folder-type or sliding-type terminal includes various arrangements of input/output devices based on of a pair of housings, and is easy to carry because the housings overlap each other during the carrying.

As a mobile communication services using the portable terminals have been diversified to include multimedia contents, such as games, moving pictures, and broadcasting, causing the portable terminals to come into widespread use by significant portions of the population. The widespread use of the portable terminals has also caused a trend in which users of the portable terminals value the terminals as personal ornaments in addition for use with services provided through the portable terminals.

As users carry portable terminals most of the time, and now that some of the users consider their portable terminal to also function as ornaments, interest in waterproofing the portable terminal is increasing. In a portable terminal having a single housing, such as a bar-type terminal, a waterproof structure can be provided by using a sealing member, such as a double-sided tape, or a gasket arranged only on bonded portions between cases of the housing and bonded portions between a window and the case installed in positions corresponding to a display device. However, a separate waterproof structure has to be provided to a speaker phone or a microphone.

On the other hand, in a portable terminal having a pair of housings, such as a folder-type terminal, circuit devices installed in the respective housings are interconnected by using a flexible printed circuit. In a path for wiring the flexible printed circuit, many difficulties exist in providing a waterproof structure.

SUMMARY OF THE INVENTION

An exemplary aspect of the present invention is to provide a waterproof structure in a wiring path of a flexible printed circuit used to connect circuit devices installed in respective housings in a portable terminal including at least a pair of housings.

Another exemplary aspect of the present invention is to provide a waterproof structure for improving the reliability of a portable terminal including at least a pair of housings.

According to yet another exemplary aspect of the present invention, there is provided a waterproof structure for a portable terminal including at least a pair of housings, the waterproof structure including a flexible printed circuit extending from an inside to an outside of a first housing of the pair of housings and arranged into an inside of a second housing of the pair of housings; a wiring hole formed in each of the first and second housings for providing a path in which the flexible printed circuit passes therethrough; and a waterproof member provided in the wiring hole to have substantial contact with at least inner walls of the pair of housings and an outer circumferential surface of the flexible printed circuit so that said flexible printed circuit is held in place by the waterproof member; wherein an outer circumferential surface of the waterproof member substantially contacts a circumference of an inlet of the wiring hole or an inner wall of the wiring hole to form a waterproof seal.

According to still another exemplary aspect of the present invention, there is provided a waterproof structure for a portable terminal comprising at least a pair of housings, the waterproof structure including a flexible printed circuit for interconnecting circuit devices provided on the pair of housings; a wiring hole formed on a surface of each of the pair of housings; and a waterproof member substantially contacting each one of the pair of housings and to an outer circumferential surface of the flexible printed circuit to hold the flexible printed circuit in place, wherein both ends of the flexible printed circuit substantially contact the waterproof member on an outer surface of each one of the pair of housings while closing the wiring hole.

According to still another exemplary aspect of the present invention, there is provided a waterproof structure for a portable terminal comprising at least a pair of housings, the waterproof structure including a flexible printed circuit interconnecting circuit devices provided on the housings and comprising a connector member in at least an end thereof;

a wiring hole formed in at least one of the housings;

a receiving recess formed in an outer surface of the housing along a circumference of the wiring hole;

a first waterproof member provided in an end of the flexible printed circuit to surround the connector member; and a second waterproof member provided on an outer circumferential surface of the first waterproof member, wherein the connector member communicates to an inside of the housing from an outside of the housing through the wiring hole, and the second waterproof member seals a gap between the first waterproof member and an inner wall of the receiving recess in a state where the connector member communicates to the inside of the housing through the wiring hole.

BRIEF DESCRIPTION OF THE DRAWINGS

The above and other features and advantages of exemplary embodiments of the present invention will become more apparent to the person of ordinary skill in the art from the following detailed description taken in conjunction with the accompanying drawings, in which.

DETAILED DESCRIPTION

Figure 1:
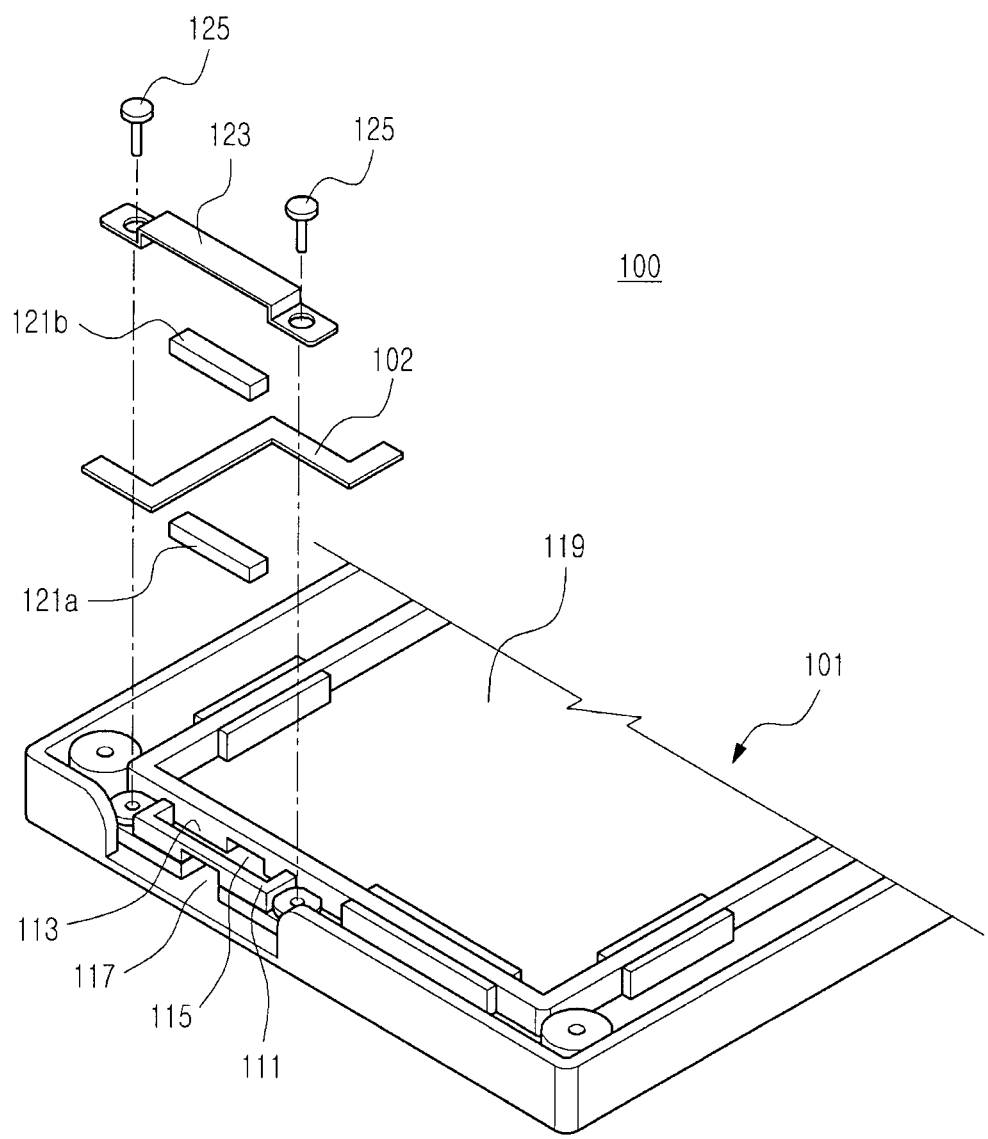
FIG. 1 is a perspective view of a waterproof structure for a portable terminal according to a first exemplary embodiment of the present invention.
Figure 2:
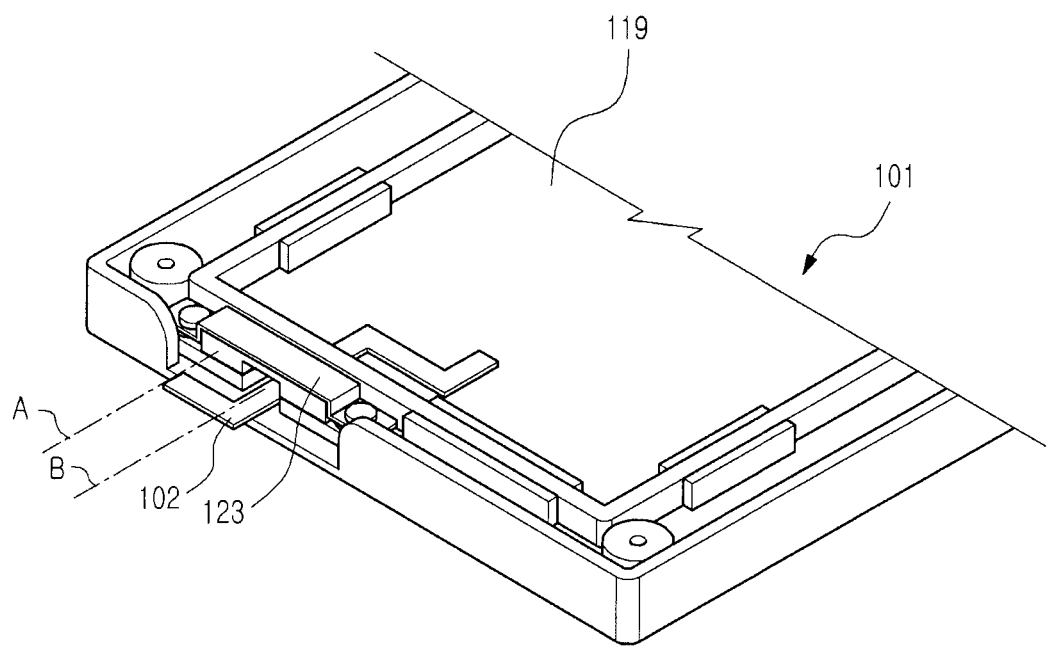
FIG. 2 is an assembled perspective view of the waterproof structure shown in FIG. 1.
Figure 3A:
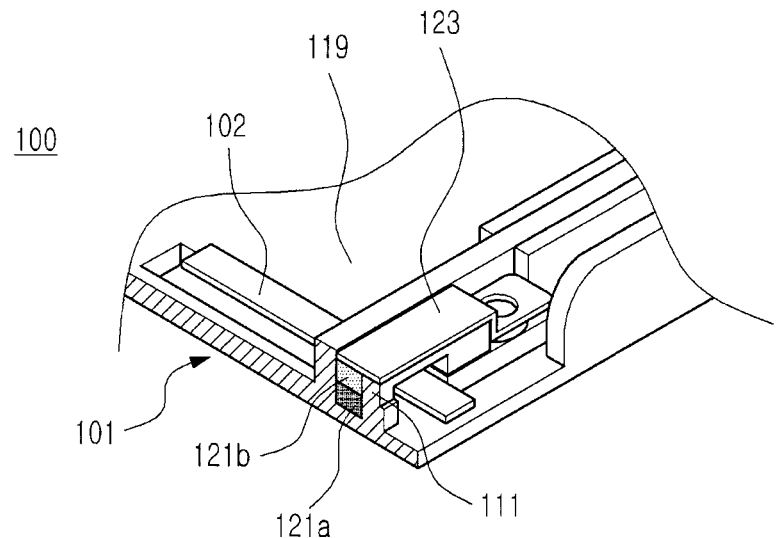
FIG. 3A is a perspective view of the waterproof structure cut away in part along a line A shown in FIG. 2.
Figure 3B:
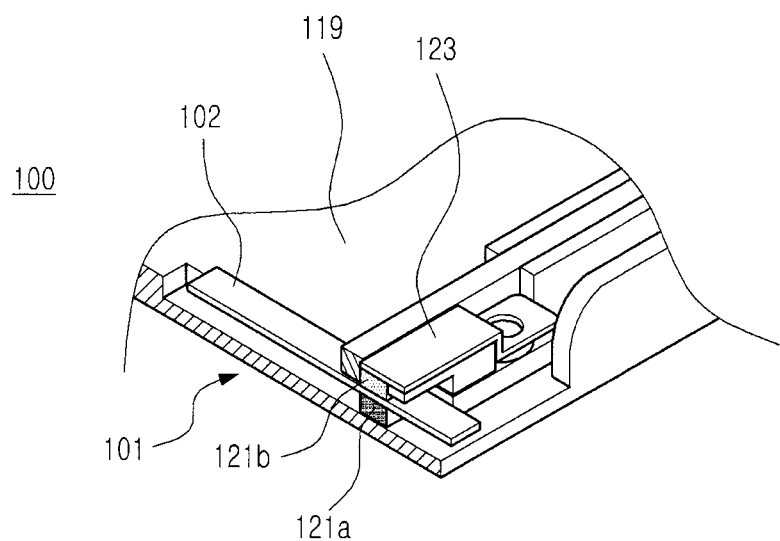
FIG. 3B is a perspective view of the waterproof structure cut away in part along a line B shown in FIG. 2.
Figure 4:
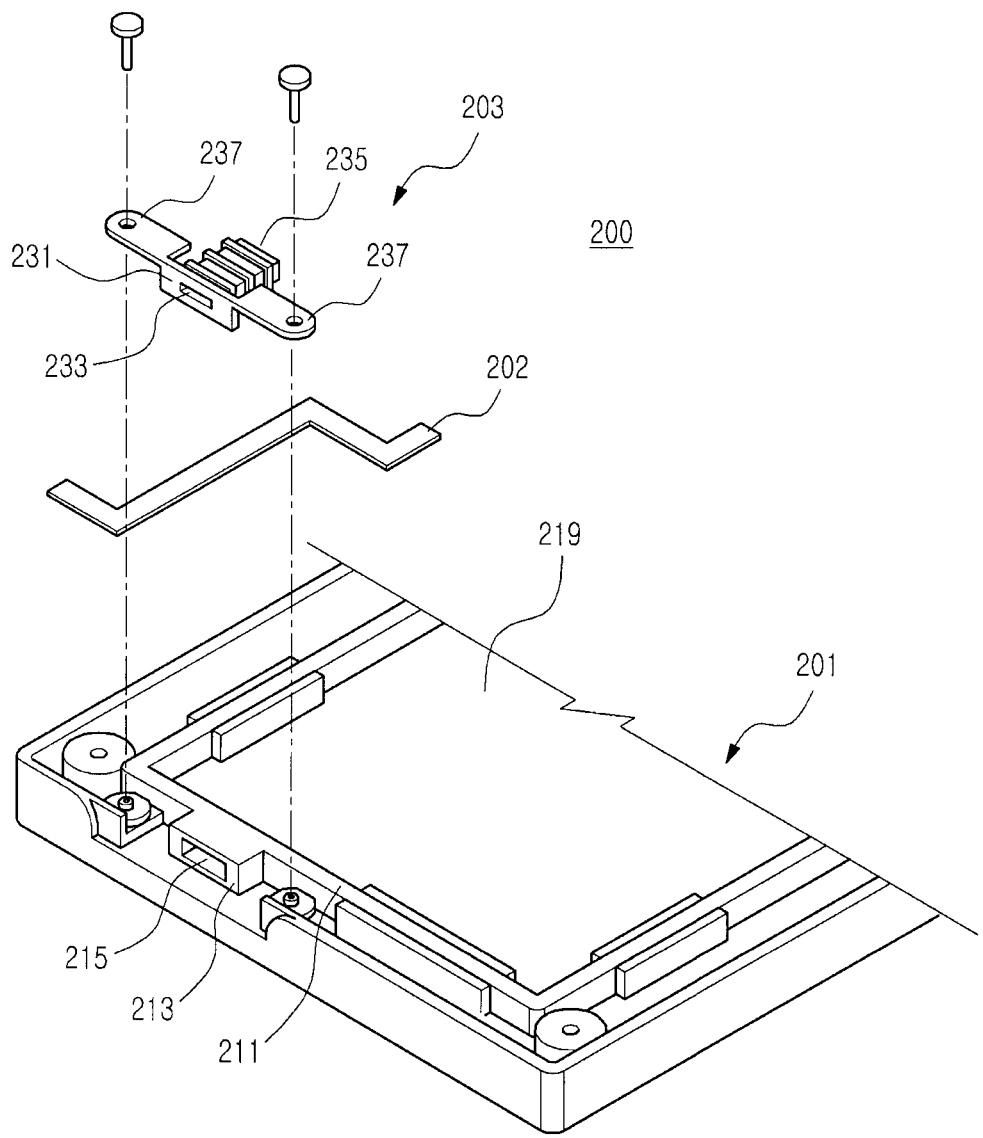
FIG. 4 is an exploded perspective view of a waterproof structure for a portable terminal according to a second exemplary embodiment of the present invention.
Figure 5:
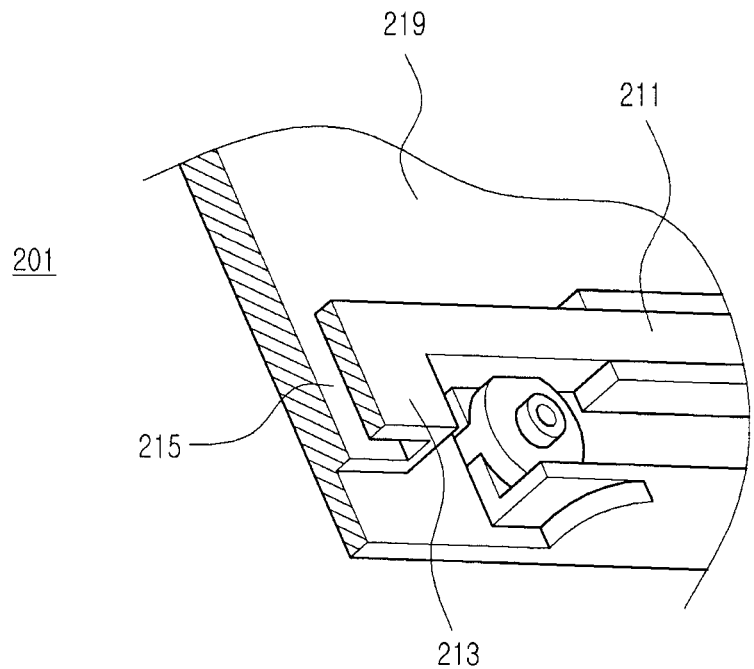
FIG. 5 is a perspective view of a housing cut away in part from the waterproof structure shown in FIG. 4.

Hereinafter, exemplary embodiments of the present invention will be described in detail with reference to the accompanying drawings. Detailed descriptions of well-known functions and constructions may be omitted for clarity and conciseness when their inclusion might obscure appreciation of the subject matter of the present by the person of ordinary skill in the art.

As shown in FIGS. 1 to 3B, in a waterproof structure 100 for a portable terminal (not shown) according to a first exemplary embodiment of the present invention, a waterproof member in substantial contact to the outer circumferential surface of a flexible printed circuit 102 substantially contacts to the circumference of the inlet of a wiring hole 115 formed in a housing 101, such that a gap between the flexible printed circuit 102 and the wiring hole 115 is sealed and movement of the waterproof member is prevented. The portable terminal includes at least a pair of housings and the flexible printed circuit 102 is intended to interconnect circuit devices installed in the respective housings.

The housing 101 receives various circuit devices, such as a control circuit, a communication circuit, a storage device, etc., in an inner space 119 thereof, and is coupled to another housing (not shown) to form the portable terminal. Inside the housing 101 are provided a partition wall forming the inner space 119 and a receiving partition wall 111 forming a receiving recess 113 for receiving the waterproof member.

That is, the receiving recess 133 is a space that is defined and surrounded by the receiving partition wall 111.

In the receiving partition wall 111 is formed the wiring hole 115 for providing a wiring path of the flexible printed circuit 102. The wiring hole 115, extending from the receiving recess 113, communicates with the inner space 119 of the housing 101. That is, the flexible printed circuit 102 is preferably inserted from outside into or withdrawn to outside from the inner space 119 of the housing 101 through the wiring hole 115.

The receiving partition wall 111 also has a through hole 117 therein that extends from the receiving recess 113 and communicates with the outside. The through hole 117, like the wiring hole 115, provides the wiring path of the flexible printed circuit 102 (shown in FIG. 1 and installed in FIG. 2). In the current exemplary embodiment, since the receiving recess 113 is provided by forming the receiving partition wall 111 to install the waterproof member, the through hole 117 which also provides the wiring path of the flexible printed circuit 102 is additionally formed. Thus, the flexible printed circuit 102, after sequentially passing through the through hole 117, the receiving recess 113, and then the wiring hole 115 from outside, is inserted into the inside of the housing 101, or is withdrawn from the inside of the housing 101 to the outside in a reverse sequence from the wiring hole 115 to the through hole 117.

Still referring to FIG. 1, the waterproof member preferably includes a first sealing member 121a and a second sealing member 121b received in the receiving recess 113, and may further include a clamp 123 for fixing contacting the first sealing member 121a and the second sealing member 121b to the inside of the receiving recess 113. The first sealing member 121a and the second sealing member 121b may be comprised of an elastic material, for example, silicone or urethane, and are received within the receiving recess 113 and facing each other, such that they contact to both surfaces of the flexible printed circuit 102.

It is preferable that sizes of the first sealing member 121a and the second sealing member 121b can be larger than that of the receiving recess 113. The reason for the large sealing member sizes is because that as the first sealing member 121a and the second sealing member 121b, when received in the receiving recess 113, are compressed, they contact to both surfaces (upper and lower, see partially exploded view of the flexible printed circuit 102 in which their outer circumferential surfaces closely contact to the inner wall of the receiving recess 113, leading to improvement in waterproof performance. In other words, the first sealing member 121a and the second sealing member 121b substantially contact to both surfaces of the flexible printed circuit 102 on their facing surfaces and substantially contact to the circumferential portion of the inlet of the wiring hole 115 on their side surfaces so as to be prevented from movement and form a seal.

At least one of the first sealing member 121a and the second sealing member 121b can be integrally provided integrated with the housing 101 by double injection, and such a sealing member may be installed as being adhered to a bottom surface of the receiving recess 113 and a portion of the circumference of the inlet of the wiring hole 115.

The clamp 123 is bound to the housing 101 by an engagement unit 125 such as a screw or other type of fastener. The clamp 123, by being bound to the housing 101 presses the second sealing member 121b to cause the second sealing member 121b to make pressurized contact with the first sealing member 121a, thereby preventing the second sealing member 121b from leaving the receiving recess 113 and improving waterproof performance.

Referring now to FIGS. 4 to 8, a waterproof structure 200 for a portable terminal according to a second exemplary embodiment of the present invention is different from the first exemplary embodiment in that a waterproof member 203 is disposed inside a wiring hole 215.

In the waterproof structure 200, a partition wall 211 forming an inner space 219 for receiving circuit devices is formed inside a housing 201, and a protrusion 213 outwardly extending from an outer surface of the partition wall 211 is provided. The protrusion 213 does not necessarily have to extend from the outer surface of the partition wall 211, and may extend from an inner surface of the partition wall 211 to the inner space 219. The wiring hole 215 extends from outside to the inner space 219 of the housing 201 through the protrusion 213 so as to provide a wiring path of a flexible printed circuit 202.

The waterproof member 203 preferably includes a body portion 231 and a waterproof portion 235. The body portion 231 is disposed on the outer surface of the partition wall 211 and the waterproof portion 235 is inserted into the wiring hole 215.

The body portion 231 may be comprised of a rigid synthetic resin in a flat-panel shape, and the waterproof portion 235, extending from an inner surface of the body portion 231, is inserted into the wiring hole 215. The waterproof portion 235 may be comprised of an elastic material such as silicone or urethane. In the waterproof member 203 is formed a slit 233 penetrating the waterproof portion 235 from the body portion 231. The flexible printed circuit 202 is coupled in such a way to pass through the slit 233.

The waterproof portion 235 is formed so as to be larger in size than the wiring hole 215, such that when the waterproof portion 235 is inserted into the wiring hole 215, its outer circumferential surface makes pressurized contact with the inner wall of the wiring hole 215 sufficient to prevent movement and thus form a seal, and the inner wall of the slit 233 also substantially contacts both surfaces of the flexible printed circuit 202 to prevent movement. This formation of the waterproof portion 235 is intended to improve waterproof performance in the wiring hole 215.

Figure 6:
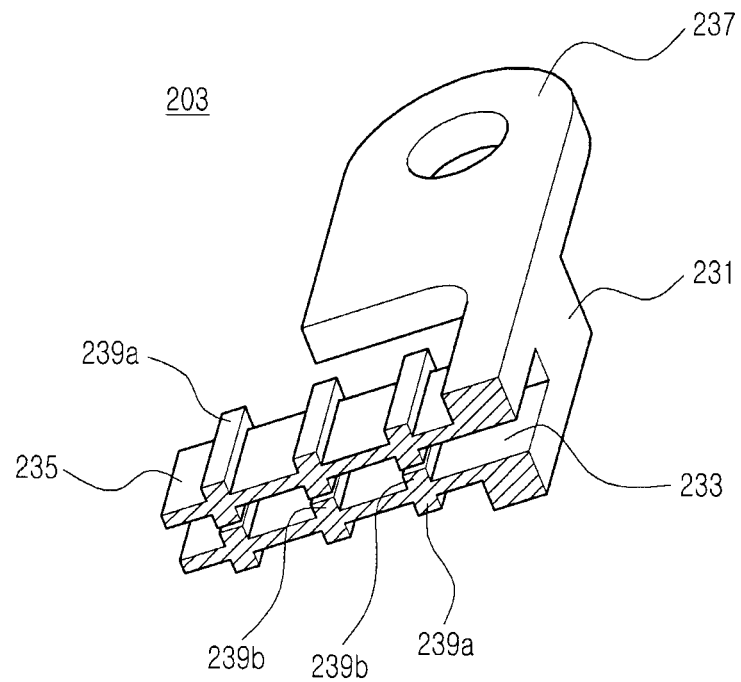
FIG. 6 is a perspective view of a waterproof member cut away in part from the waterproof structure shown in FIG. 4.
Figure 7:
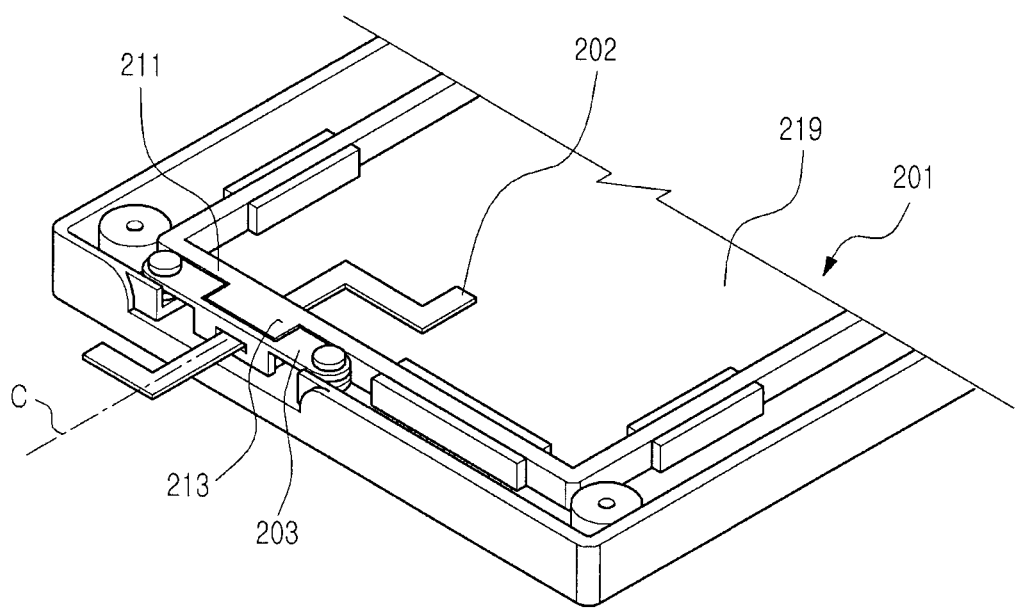
FIG. 7 is an assembled perspective view of the waterproof structure shown in FIG. 4.
Figure 8:
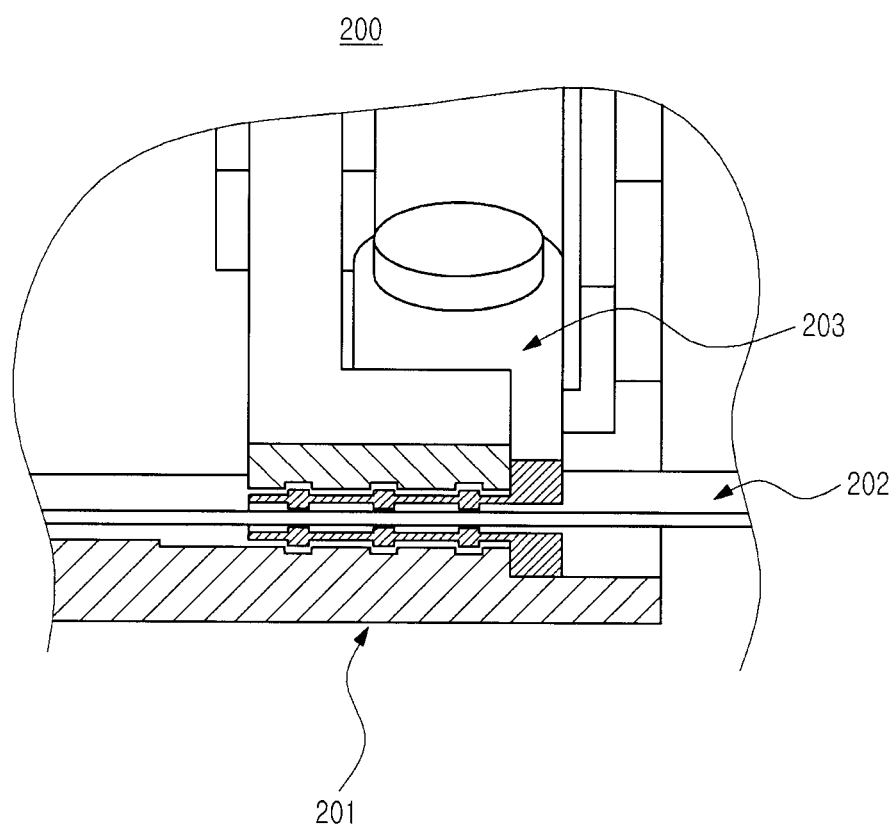
FIG. 8 is a perspective view of the waterproof structure cut away in part along a line C shown in FIG. 7.

As shown in FIGS. 6 to 8, in the current exemplary embodiment, on the outer circumferential surface of the waterproof portion 235 and the inner wall of the slit 233 are formed sealing protrusions 239a and 239b, end portions of which closely contact to the inner wall of the wiring hole 215 and the both surfaces of the flexible printed circuit 202, respectively. By way of example, the sealing protrusion 239a formed on the outer circumferential surface of the waterproof portion 235 is depicted as three protrusions formed in a band shape on the circumference of the waterproof portion 235. The number of sealing protrusion 239a is not limited to what is shown and described herein, and it is within the spirit of the invention and the scope of the appended claims that the actual number is subject to consideration of the required waterproof performance desired, the length of the waterproof portion 235, and so forth.

As shown in FIG. 6, the sealing protrusion 239b formed on the inner wall of the slit 233 is in this example formed in a band shape and positioned corresponding to the sealing protrusion 239a. In this way, the end portions of the sealing protrusion 239a and the sealing protrusion 239b closely contact to the inner wall of the wiring hole 215 and the both surfaces of the flexible printed circuit 202, thereby improving waterproof performance.

That is, the size of the waterproof portion 235 may be larger than that of the wiring hole 215 so that the waterproof portion 235, when inserted under pressure in order to fit, can substantially contact the inner wall of the wiring hole 215 by its elastic force such that a seal is formed and movement of the waterproof portion is prevented. In the current exemplary embodiment, however, waterproof performance is further improved by using the sealing protrusions 239a and 239b.

The waterproof member 203 may include, for example, engagement pieces 237 extending from the body portion 231, and the engagement pieces 237 are fixed to the inside of the housing 201 by means of an engaging means such as a screw, fastener, clamp, or possibly by an adhesive. Thus, the waterproof member 203 is installed as being fixed onto the housing 201.

Figure 9:
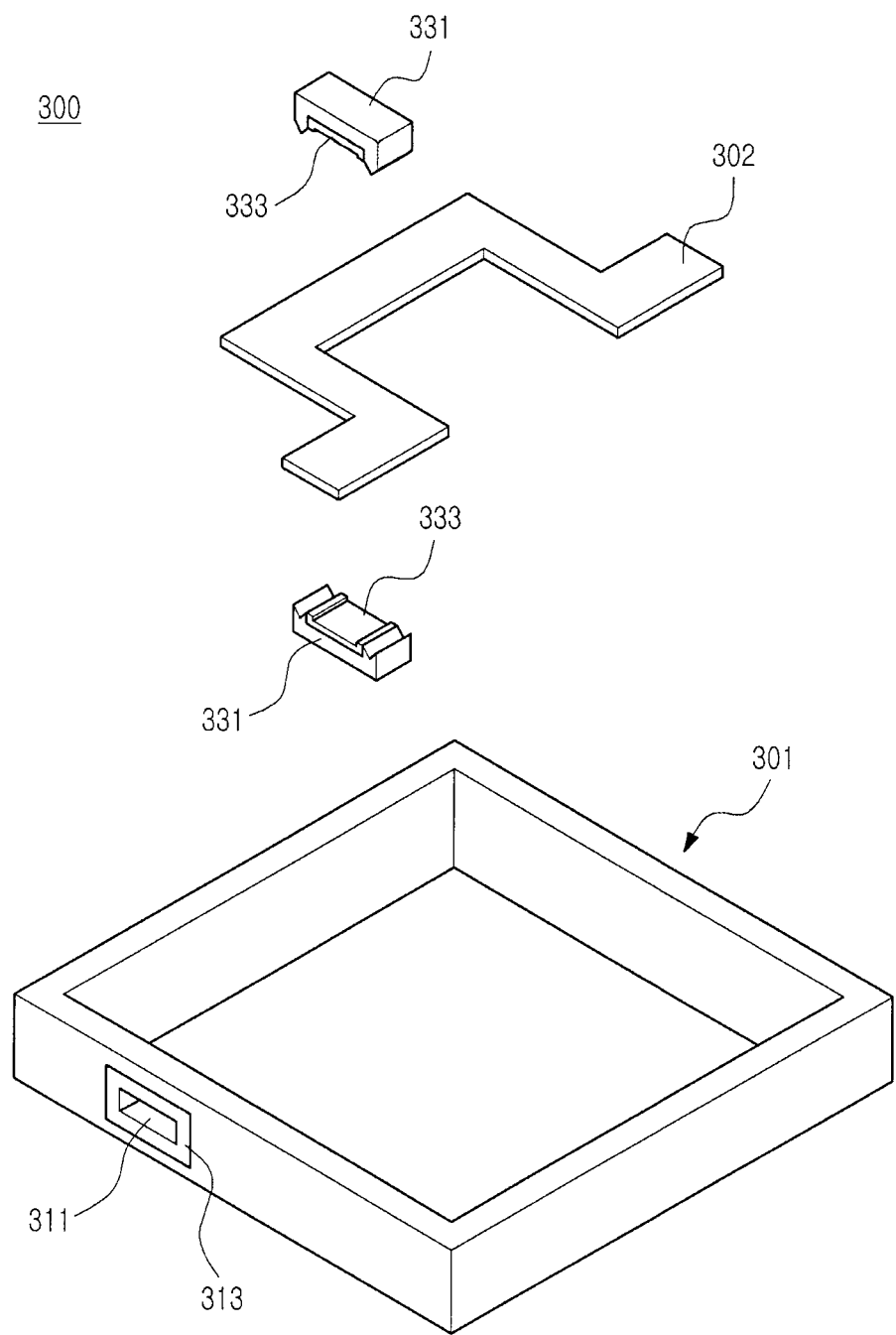
FIG. 9 is an exploded perspective view of a waterproof structure for a portable terminal according to a third exemplary embodiment of the present invention.
Figure 10:
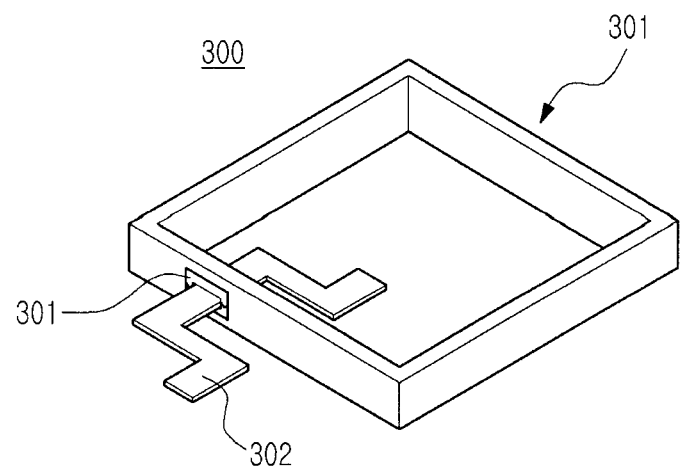
FIG. 10 is an assembled perspective view of the waterproof structure shown in FIG. 9.
Figure 11:
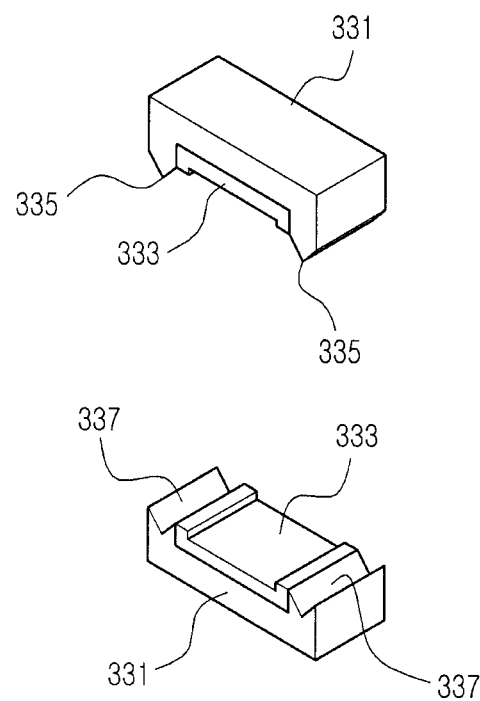
FIG. 11 is an exploded perspective view of a waterproof member for the waterproof structure shown in FIG. 9.

FIGS. 9 to 11 show a waterproof structure 300 for a portable terminal according to a third exemplary embodiment of the present invention.

A waterproof member of the waterproof structure 300 is shown in a state of being assembled onto a flexible printed circuit 302, is assembled to a wiring hole 311 formed in a housing 301 of the portable terminal, an example of which is shown in the drawings.

With continued reference to FIG. 9, the housing 301 may have a partition wall inside, similar to the previous exemplary embodiments, but in the current exemplary embodiment, the housing 301 has a wiring hole 311 penetrating therethrough from an outer surface to an inner surface without a separate partition wall.

The waterproof member preferably includes a pair of coupling members 331 and a pair of sealing members 333. The coupling members 331 are provided to cover three surfaces of the sealing members 333, respectively. That is, as shown in FIG. 11, both end portions of each of the coupling members 331 are bent to face each other and the sealing members 333 are adhered to inner surfaces of the coupling members 331, respectively.

The coupling members 331 may be comprised of a rigid synthetic resin such as polycarbonate, and the sealing members 333 may be comprised of an elastic material such as silicone or urethane, just to name a few possibilities.

Referring again to FIG. 11, one of the coupling members 331 has fusion protrusions 335 at the bent end portions thereof and the other has fusion grooves 337 at the bent end portions thereof and in alignment with the fusion protrusions. The coupling members 331 are coupled to each other, facing each other and having the sealing members 333 therebetween. The fusion protrusions 335 are placed in the fusion grooves 337, respectively. The flexible printed circuit 302 is wired between the sealing members 333. That is, the sealing members 333 substantially contact both surfaces of the flexible printed circuit 302 such that the flexible printed circuit 302 is unable to move.

The coupling members 331 in this example can be bonded to each other, for example, by ultrasonic fusion. That is, when the fusion protrusions 335 are placed in the fusion grooves 337, ultrasonic fusion is performed, thereby bonding the coupling members 331 to each other. In this way, the sealing members 333 and the coupling members 331 are fixed to the flexible printed circuit 302.

The sealing members 333 and the coupling members 331 during a state of being fixed to the flexible printed circuit 302 are inserted and fixed to the wiring hole 311. Thus, the flexible printed circuit 302 is installed so they can be withdrawn to the outside from, or inserted from outside into the inside of the housing 301. When the coupling members 331 are comprised of rigid synthetic resin, the waterproof performance between the outer circumferential surfaces thereof and the inner wall of the wiring hole 311 may be degraded. To address the degradation problem, as shown in FIG. 9, a second sealing member 313 may be installed on the inner wall of the wiring hole 311.

It is preferable that the second sealing member 313 be comprised of an elastic material such as silicone or urethane.

Thus, the sealing members 333 improve waterproof performance between the flexible printed circuit 302 and the coupling members 331, and the second sealing member 313 improves waterproof performance between the coupling members 331 and the inner wall of the wiring hole 311.

FIGS. 12 to 19 show a waterproof structure 400 for a portable terminal 40 according to a fourth exemplary embodiment of the present invention.

Figure 12:
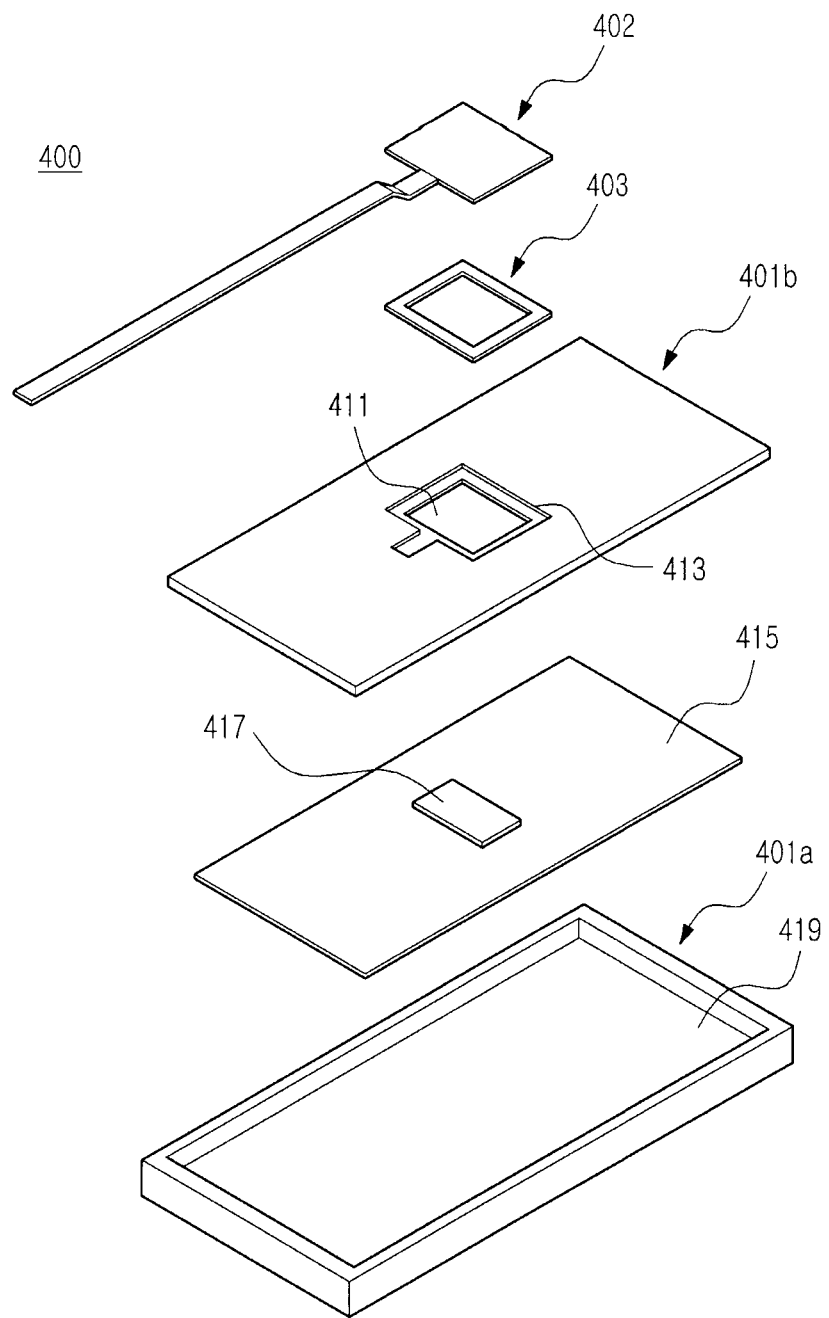
FIG. 12 is an exploded perspective view of a waterproof structure for a portable terminal according to a fourth exemplary embodiment of the present invention.
Figure 13:
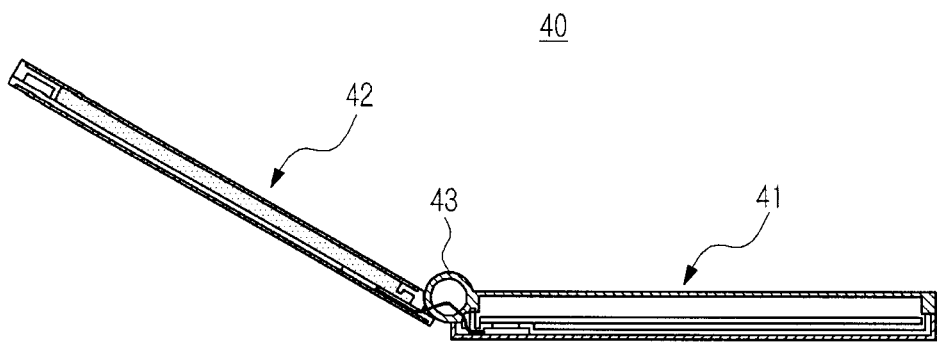
FIG. 13 is a cross-sectional view showing an example of a portable terminal to which the waterproof structure shown in FIG. 9 is applied.
Figure 14:
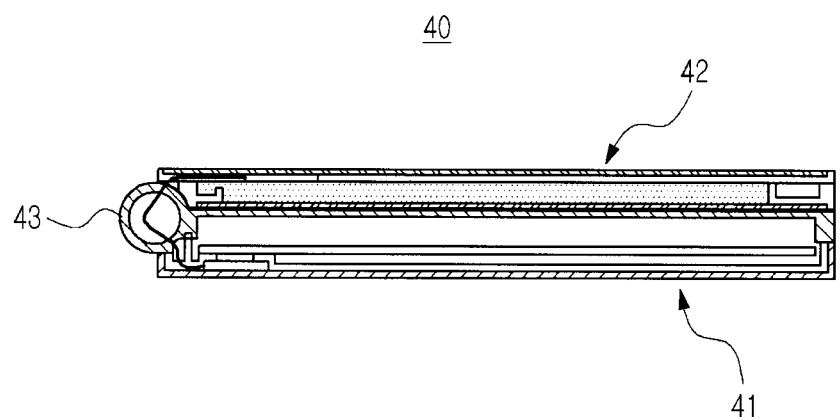
FIG. 14 is a cross-sectional view showing housings of the portable terminal shown in FIG. 13 are folded together.
Figure 15:
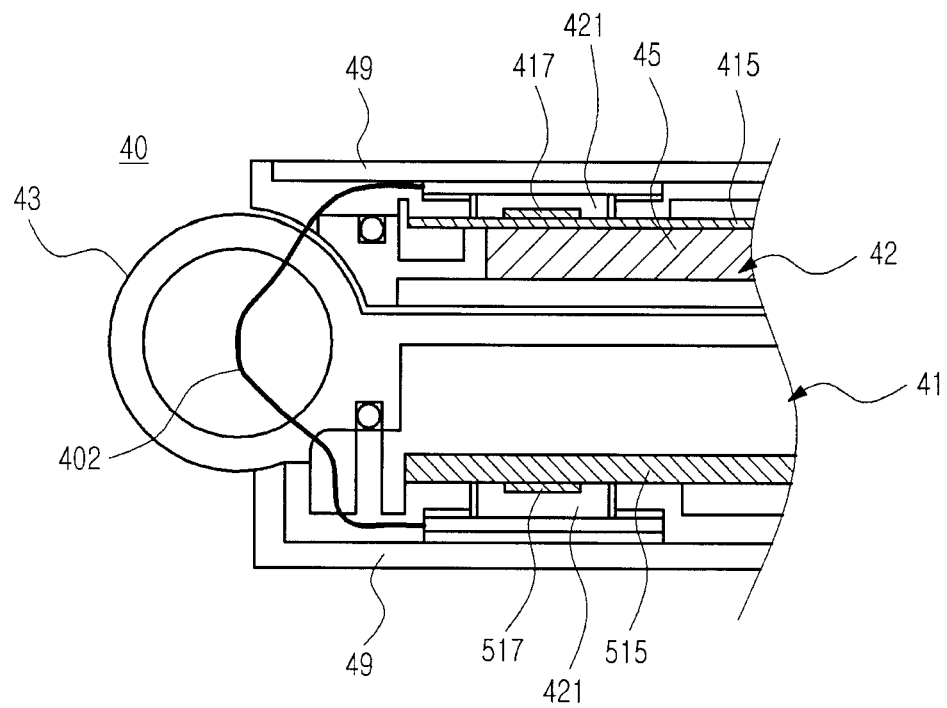
FIGS. 15 and 16 are views showing enlargements of the waterproof structure shown in FIG. 14.
Figure 16:
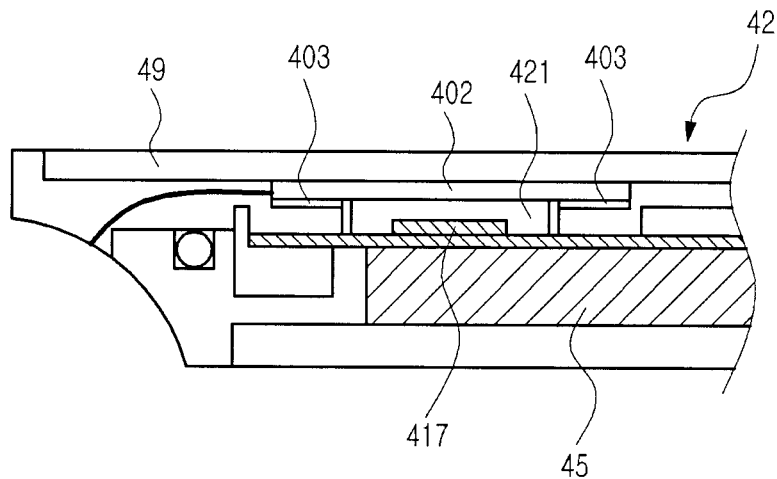

Referring now to FIG. 12, the waterproof structure 400 includes a wiring hole 411 therein for providing a wiring path for a flexible printed circuit 402 that is formed in one surface of a housing 401. That is, in case of a housing of a folder-type terminal, the waterproof structure 400 may be applied to a product in which a wiring hole is formed in a surface exposed at all times regardless of the opening/closing of the housing.

The housing 401 preferably includes a first case 401a and a second case 401b which are coupled facing each other. In an inner side 419 of the housing 401 is received a printed circuit board 415 where a connector socket 417 is installed. The second case 401b has the wiring hole 411 penetrating an inner surface and an outer surface thereof. The flexible printed circuit 402 and a waterproof member 403 are adhered to the circumference of the inlet of the wiring hole 411 on the outer surface of the housing 401. To prevent the flexible printed circuit 402 and the waterproof member 403 from protruding from the outer surface of the housing 401, a receiving recess 413 may be formed in the housing 401, more specifically, in an outer surface of the second case 401b.

Figure 17:
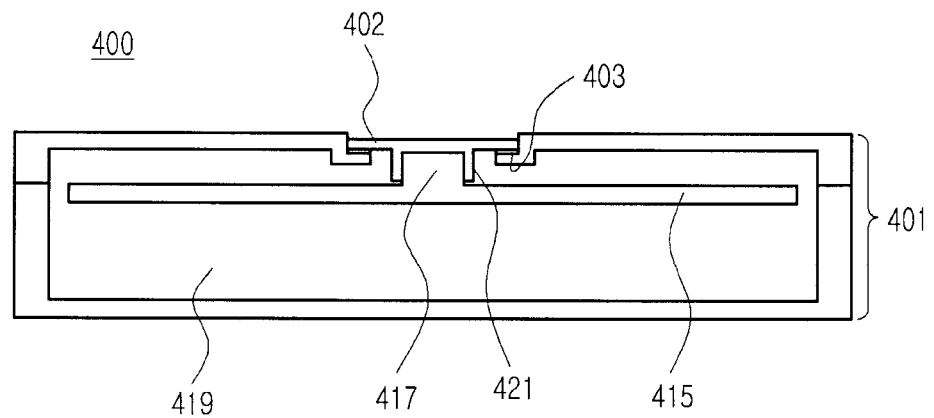
FIGS. 17 to 19 show modified examples of the waterproof structure shown in FIG. 4.
Figure 18:
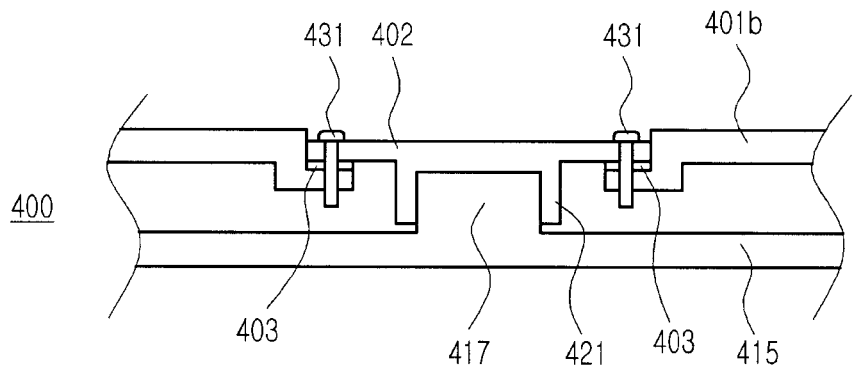
Figure 19:
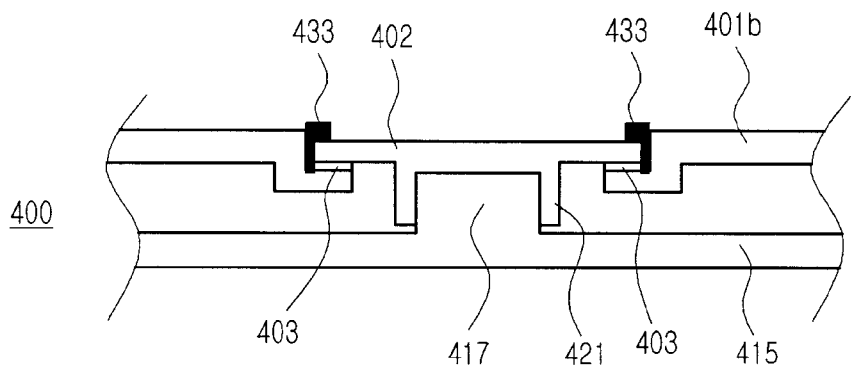

The waterproof member 403 may comprise a double-sided tape, and if not, the flexible printed circuit 402 has to substantially contact the waterproof member 403 by means of a separate engagement member and the waterproof member 403 has to substantially contact the circumference of the wiring hole 411. FIGS. 17 to 19 show some exemplary various forms of such substantially contacted structures.

In FIG. 17, the waterproof member 403 comprises a double-sided tape as mentioned above and thus provides a waterproof function between the flexible printed circuit 402 and the circumference of the wiring hole 411.

In FIG. 18, the flexible printed circuit 402 comes into substantial contact with the waterproof member 403 by separate engagement means 431, including but in no way limited to screws, and the waterproof member 403 comes into substantial contact to the circumference of the wiring hole 411 so that movement is prevented, thereby providing a waterproof function.

In FIG. 19, separate binding members 433 are interposed between the inner wall of the receiving recess 413 and side surfaces of the waterproof member 403 and the flexible printed circuit 402. End portions of the binding members 433 are bent to press the edge of the flexible printed circuit 402, such that the flexible printed circuit 402 and the waterproof member 403 come into substantial contact with the waterproof member 403 and the circumference of the wiring hole 411, respectively.

Although the waterproof member 403 has substantial contact with the flexible printed circuit 402 and the circumference of the wiring hole 411 by a fastener or a binding member in FIGS. 18 and 19, the waterproof member 403 may comprise a double-sided tape and be made of an elastic material such as silicone or urethane.

The flexible printed circuit 402 has connectors 421 installed on end portions thereof and are disposed on the wiring hole 411. More specifically, the end portions of the flexible printed circuit 402 close the wiring hole 411, with the edge thereof substantially contacting with the waterproof member 403 to prevent movement of the flexible printed circuit 402 and form a water resistant seal. The connectors 421 are disposed in the inner side 419 of the housing 401 through the wiring hole 411.

Hence, according to this exemplary aspect of the present invention, the flexible printed circuit 402 itself closes the wiring hole 411, thereby providing a waterproof function. Between the flexible printed circuit 402 and the outer surface of the housing 401, specifically, the circumference of the wiring hole 411, the waterproof member 403 provides a waterproof function.

FIGS. 13 through 16 show an example of a portable terminal 40 to which the waterproof structure 400 can be applied. The portable terminal 40 preferably comprises a folder-type terminal in which a main board 515 (FIG. 15) is installed on the first housing 41, a display device 45 is installed on a second housing 42, and the second housing 42 is coupled to the first housing 41 by a hinge device 43 such that the second housing 42 rotates in a direction toward or away from the first housing 41.

A first connector socket 517 for connecting to the flexible printed circuit 402 is installed on the main board 515, and a second connector socket 417 for connecting to the flexible printed circuit 402 is installed on a circuit board 415 provided on the display device 45. On both end portions of the flexible printed circuit 402 are formed the connectors 421 corresponding to the first connector socket 517 and the second connector socket 417 in a form protruding from the flexible printed circuit 402. Therefore, even when the end portions of the flexible printed circuit 402 are positioned outside the first housing 41 or the second housing 42, the connector 421 can be positioned inside the first housing 41 or the second housing 42 through the wiring hole 411.

When the connectors 421 are connected to the first connector socket 517 and the second connector socket 417, respectively, the flexible printed circuit 402 is wired extending along the surfaces of the first housing 41 and the second housing 42 and passing through the hinge device 43. Since the flexible printed circuit 402 may spoil the appearance of the portable terminal 40 because of extending along the surfaces of the first housing 41 and the second housing 42, separate covers 49 may be coupled/connected or arranged onto the outer surfaces of the first housing 41 and the second housing 42 to hide the flexible printed circuit 402 from view. The covers 49 also press the flexible printed circuit 402 and thus cause the flexible printed circuit 402 to be substantially contact the circumference of the wiring hole 411, contributing to improvement of waterproof performance.

Figure 20:
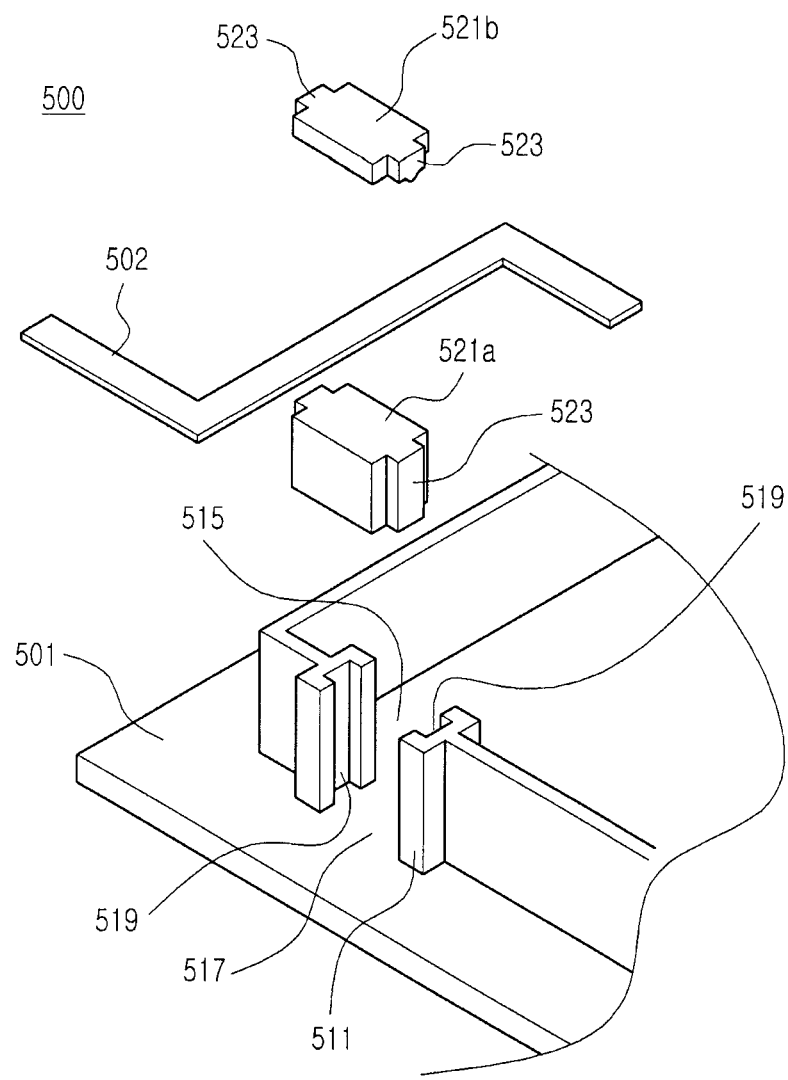
FIG. 20 is an exploded perspective view of a waterproof structure for a portable terminal according to a fifth exemplary embodiment of the present invention.
Figure 21:
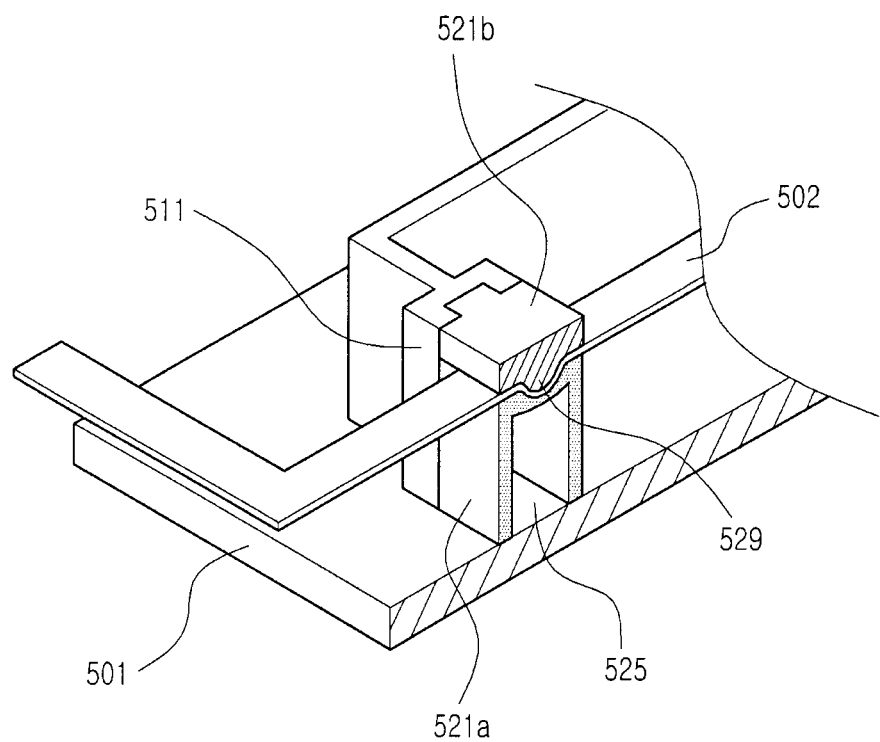
FIG. 21 is an assembled perspective view cut away in part from the waterproof structure shown in FIG. 20.

FIGS. 20 and 21 show a waterproof structure 500 for a portable terminal according to a fifth exemplary embodiment of the present invention. The waterproof structure 500 is similar to the first exemplary embodiment, except for first and second waterproof members.

As shown in FIGS. 20 and 21, like in the first exemplary embodiment, the waterproof structure 500 is structured such that a receiving partition wall 511 is formed in a housing 501 to form a receiving recess surrounded by the receiving partition wall 511, and a wiring hole 515 extending from the receiving recess to the inside of the housing 501 and a through hole 517 extending to the outside of the housing 501 are formed.

Binding grooves 519 are formed in both side walls of the receiving recess, thereby providing engaging a first waterproof member 521a and a second waterproof member 521b. More specifically, the first waterproof member 521a and the second waterproof member 521b have binding protrusions 523 on both side ends thereof, such that the binding protrusions 523 are engaged with the binding grooves 519 and thus the first waterproof member 521a and the second waterproof member 521b are fixed inside the receiving recess.

The first waterproof member 521a and the second waterproof member 521b, together with the binding protrusions 523, may be comprised of an elastic material such as silicone or urethane, and the blinding protrusions 523 may be formed larger in size than the receiving recess. With such a structure, the binding protrusions 523 can be more firmly engaged with the binding grooves 519 because of the pressure require to compress-fit the waterproof members together.

As mentioned previously, the first waterproof member 521a and the second waterproof member 521b are preferably comprised of an elastic material. The first waterproof member 521 has a hollow 525 formed therein, and once installed in the receiving recess, its one end surface faces the second waterproof member 521b. The second waterproof member 521b includes a substantially contacted protrusion 529 formed on a surface thereof. The flexible printed circuit 502 is wired between the first waterproof member 521a and the second waterproof member 521b, and the substantial contact protrusion 529 presses the flexible printed circuit 502 to cause the flexible printed circuit 502 to substantially contact the first waterproof member 521a, such that the waterproof structure 500 is completed around the flexible printed circuit 502.

FIGS. 22 through 25 show a waterproof structure 600 for a portable terminal according to a sixth exemplary embodiment of the present invention. As shown in the drawings, the portable terminal including the waterproof structure 600 according to the sixth exemplary embodiment of the present invention is provided with a connection means of a flexible printed circuit 603 through a wiring hole 625 formed in a housing 602, and the waterproof structure 600 is provided in the wiring hole 625 to provide a waterproof function on a wiring path of the flexible printed circuit 603.

Figure 22:
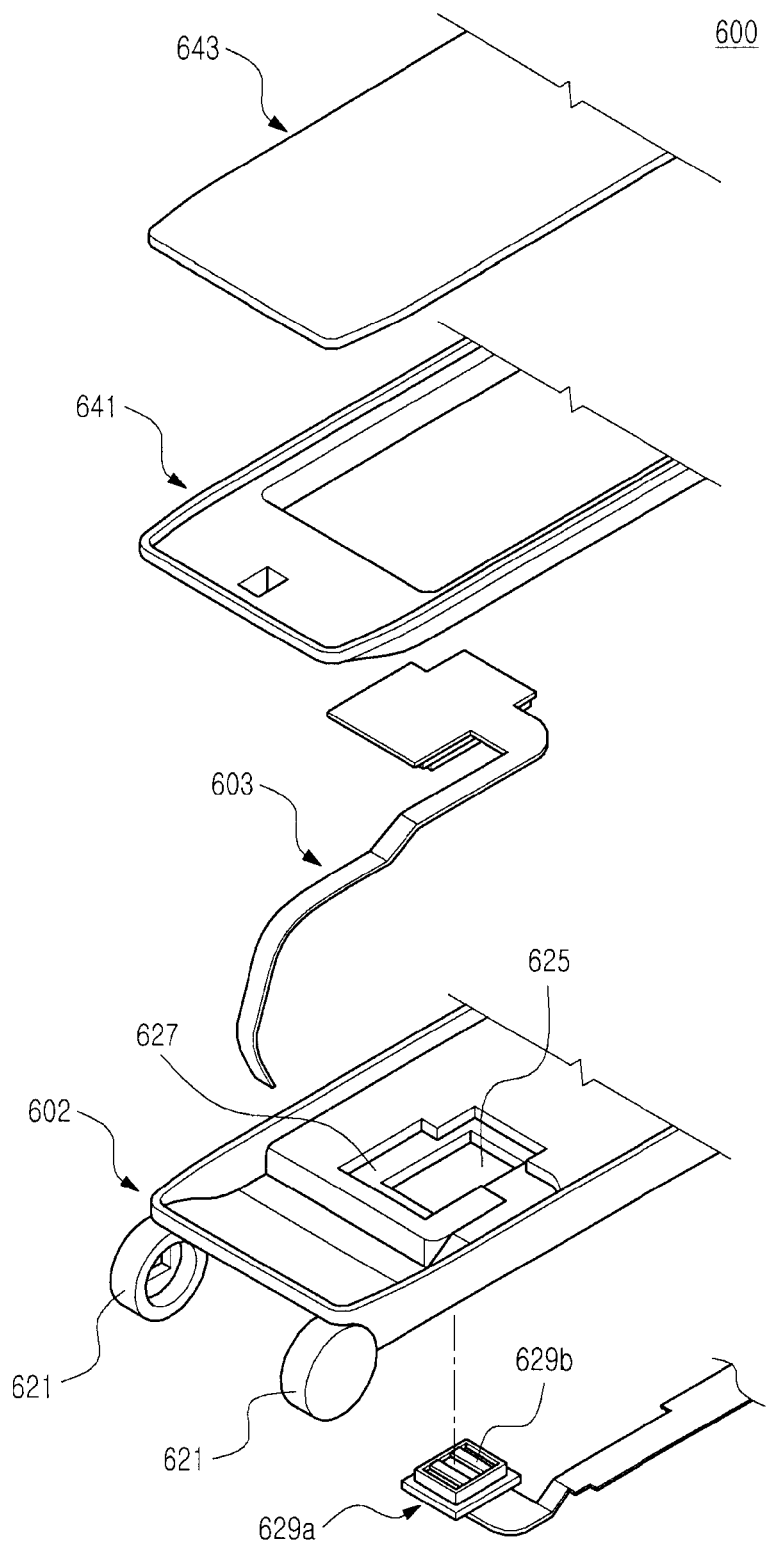
FIG. 22 is an exploded perspective view of a waterproof structure for a potable terminal according to a sixth exemplary embodiment of the present invention.

While the portable terminal is shown as a folder-type terminal having a pair of housings, but it should be noted that one of a pair of housings of a folder-type terminal is shown in FIG. 22.

The portable terminal, by including the flexible printed circuit 603, connects another housing (not shown) with circuit devices included in the housing 602. The flexible printed circuit 603 extends to an outside of the housing 602 through side hinge arms 621 provided at both sides of an end portion of the housing 602, and communicates with an inside of the housing 602 through the wiring hole 625 formed in a surface of the housing 602.

On an inner surface of the housing 602 are arranged both a display device (not shown) and a circuit board 629a connected to the display device. The flexible printed circuit 603 is connected to a female connector 629b provided at an end portion of the circuit board 629a.

On an outer surface of the housing 602 is formed a receiving recess 627 surrounding the wiring hole 625. The receiving recess 627 is recessed from the outer surface of the housing 602 and completes the waterproof structure 600, together with a first waterproof member 637 and a second waterproof member 639 which will be described below.

Figure 23:
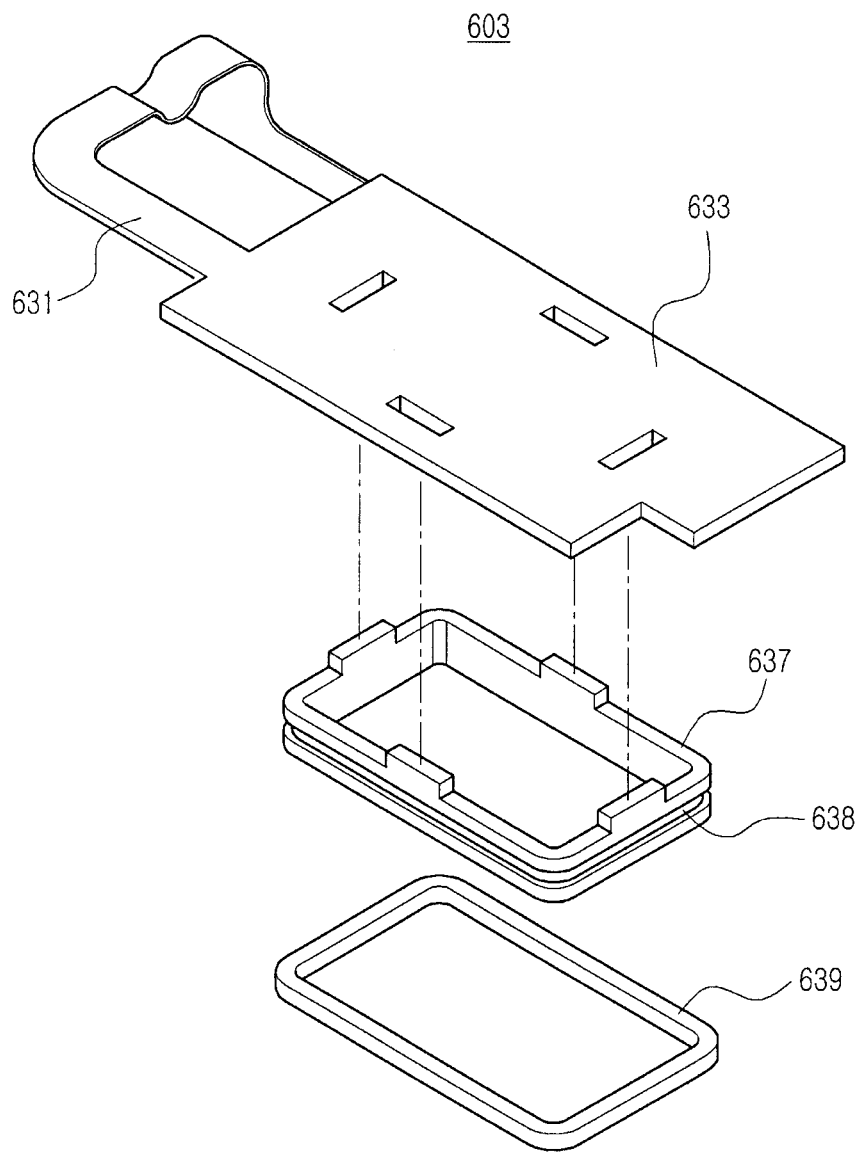
FIG. 23 is an exploded perspective view of a flexible printed circuit of the portable terminal shown in FIG. 22.
Figure 24:
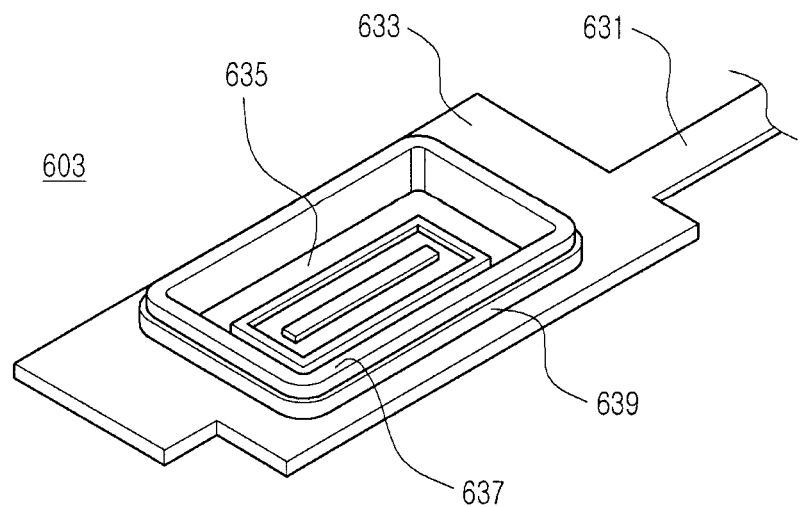
FIG. 24 is an assembled perspective view of the flexible printed circuit shown in FIG. 23.
Figure 25:
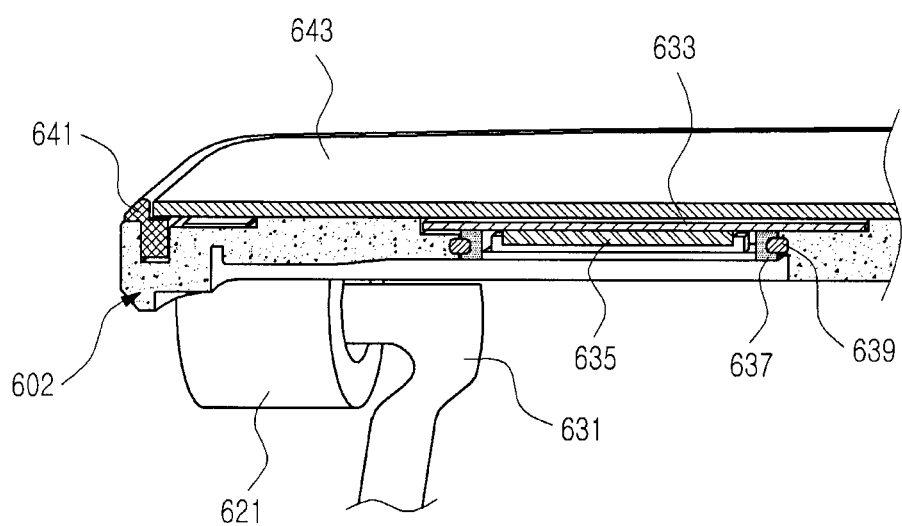
FIG. 25 is a cross-sectional view of the waterproof structure for the portable terminal shown in FIG. 22.

FIGS. 23 and 24 show installation structures of the flexible printed circuit 603 and the first waterproof member 637 and the second waterproof member 639 provided at an end portion of the flexible printed circuit 603.

The flexible printed circuit 603 preferably includes a flexible printed circuit member 631 extending over the housing 602 and a housing (not shown) and a reinforcement member 633 provided at an end portion of the flexible printed circuit member 631. The flexible printed circuit member 631 is flexible so that it can be properly deformed as the housings rotate or slide with respect to each other. On the other hand, the reinforcement member 633 comprised of a non-flexible rigid material, maintains a flat plate shape. For this reason, the reinforcement member 633 is provided only at an end portion of the flexible printed circuit member 631. At an end of the flexible printed circuit 603, specifically, at an end of the flexible printed circuit member 631 is provided a connector member 635 to provide a means connected to the female connector 629b. The connector member 635 is provided on a surface of the reinforcement member 633.

The first waterproof member 637 and the second waterproof member 639 are provided on a surface of the flexible printed circuit 603, specifically, on a surface of the reinforcement member 633. A waterproof function is provided between the first and second waterproof members 637 and 639 and an inner wall of the receiving recess 627 to prevent the inside of the housing 602 from being contaminated by moisture even when the flexible printed circuit 603 is wired through the wiring hole 625 or a connection structure with the female connector 629b is disposed.

The first waterproof member 637 substantially contacts and is fixed on a surface of the reinforcement member 633 and surrounds the connector member 635. In order to firmly affix the first waterproof member 637 to the reinforcement member 633, the reinforcement member 633 may be provided with a binding hole and the first waterproof member 637 may be provided with a binding protrusion. In an outer circumferential surface of the first waterproof member 637 is formed a fixing groove 638.

The first waterproof member 637 may substantially contact and be affixed to a surface of the reinforcement member 633 by means of a separate assembly process, or the first waterproof member 637 may be formed and at the same time be fixed to a surface of the reinforcement member 633 by means of an insert molding process. For example, by forming the first waterproof member 637 in a state where the flexible printed circuit 603 including the reinforcement member 633 is disposed in advance in a proper position in a mold for forming the first waterproof member 637, the first waterproof member 637 may be formed and at the same time, may substantially contact and be affixed to a surface of the reinforcement member 633. Since the fixing is made by insert molding, sealing of a gap between the first waterproof member 637 and the reinforcement member 633 can be reinforced and a separate assembly process is not required, facilitating manufacturing.

The second waterproof member 639 is preferably comprised of an elastic material such as urethane, and is coupled to the fixing groove 638 so as to surround the first waterproof member 637. The second waterproof member 639 may be preferably an o-ring and a cross section thereof may be various in shape as long as it surrounds the first waterproof member 637.

Once the connector member 635 is disposed on the wiring hole 625, the first waterproof member 637 is disposed as being received in the receiving recess 627, and the second waterproof member 639 is interposed between an inner wall of the receiving recess 627 and the first waterproof member 637. The second waterproof member 639 has a cross-sectional width which is larger than an interval between the first waterproof member 637 and the inner wall of the receiving recess 627. The second waterproof member 639, when being interposed between the receiving recess 627 and the first waterproof member 637, substantially contacts an outer circumferential surface of the first waterproof member 637 and the inner wall of the receiving recess 627. Hence, the wiring hole 625 is sealed, thus completing a waterproof function.

On the inner surface of the housing 602 are disposed a display device and a window (not shown) and the circuit board 629a. On the outer surface of the housing 602 is installed a cover member 643 for covering a structure such as the receiving recess 627. The cover member 643 may be used to decorate the exterior of the housing 602, and may be attached to the outer surface of the housing 602 through a separate dummy cover 641. Since the housing 602 is used for a folder-type terminal as mentioned previously, if a small display device is installed between the outer surface of the housing 602 and the cover member 643, brief terminal status information can be displayed even when the display device on the inner surface of the housing 602 is closed by folding of the housing 602.

FIGS. 26 through 29 show examples of a waterproof structure for a portable terminal according to a seventh exemplary embodiment of the present invention. Similar to the preceding exemplary embodiments, the waterproof structure for the portable terminal according to the current exemplary embodiment of the present invention is provided in a wiring path of a flexible printed circuit used to connect circuit devices installed in respective housings of the portable terminal including at least a pair of housings. Generally, it can be easily understood by those of ordinary skill in the art that the waterproof structure can be provided between the front case and the rear case as well as in the wiring path of the flexible printed circuit, taking into account a structure where each of the housings is formed by coupling between a front case and a rear case. The waterproof structure for the portable terminal according to the current exemplary embodiment of the present invention can be provided not only between the front case and the rear case of each of the housings, but also in the wiring path of the flexible printed circuit.

Figure 26:
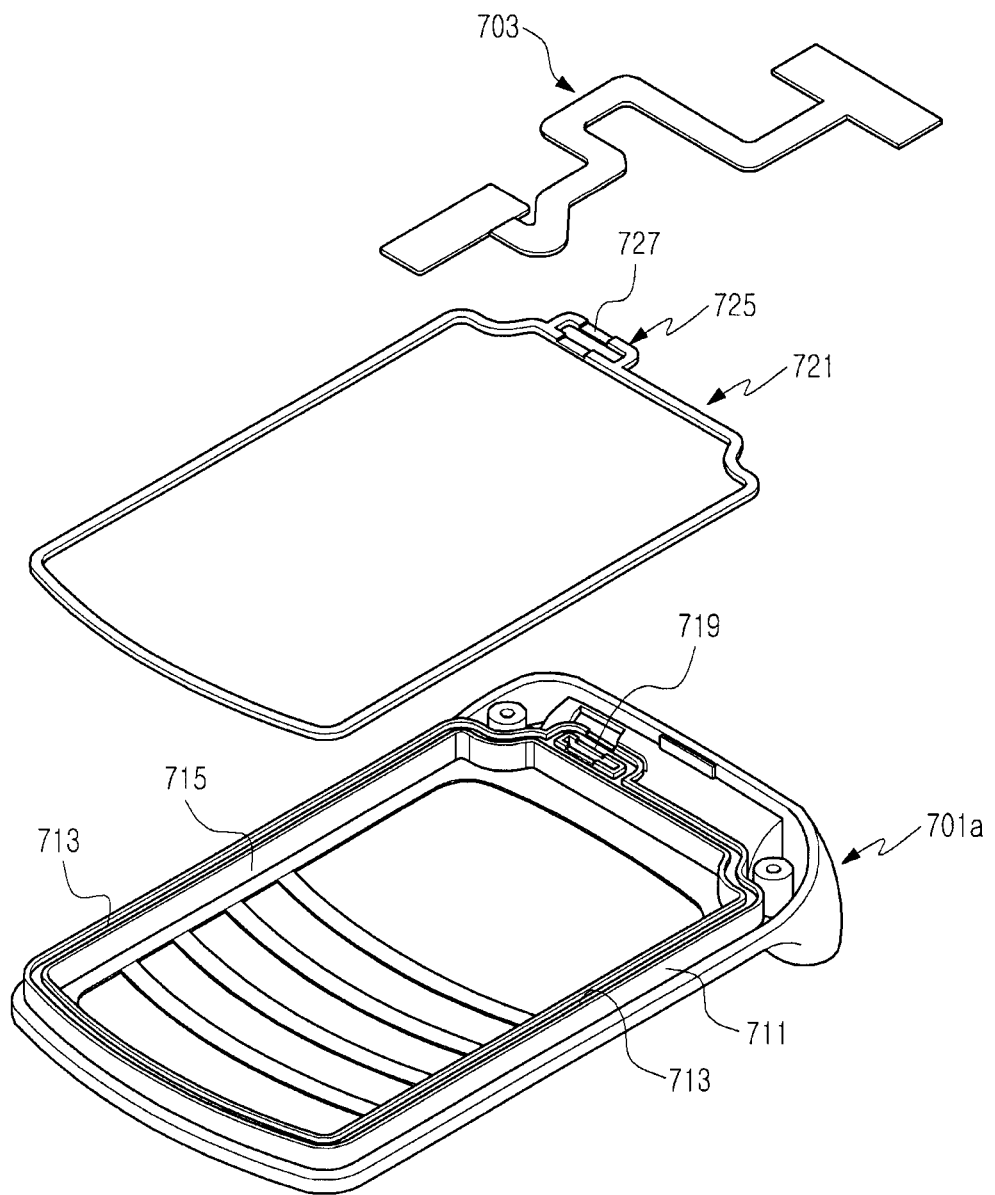
FIG. 26 is an exploded perspective view of a part of a waterproof structure for a portable terminal according to a seventh exemplary embodiment of the present invention.
Figure 27:
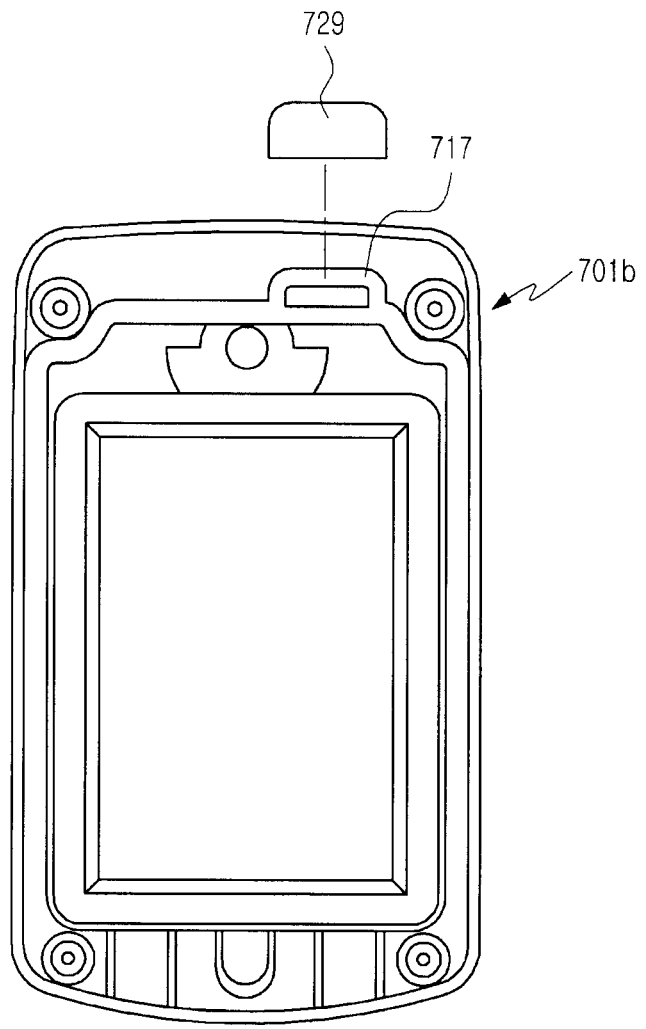
FIG. 27 is a plan view of the remaining part of the waterproof structure for the portable terminal according to the seventh exemplary embodiment of the present invention.
Figure 28:
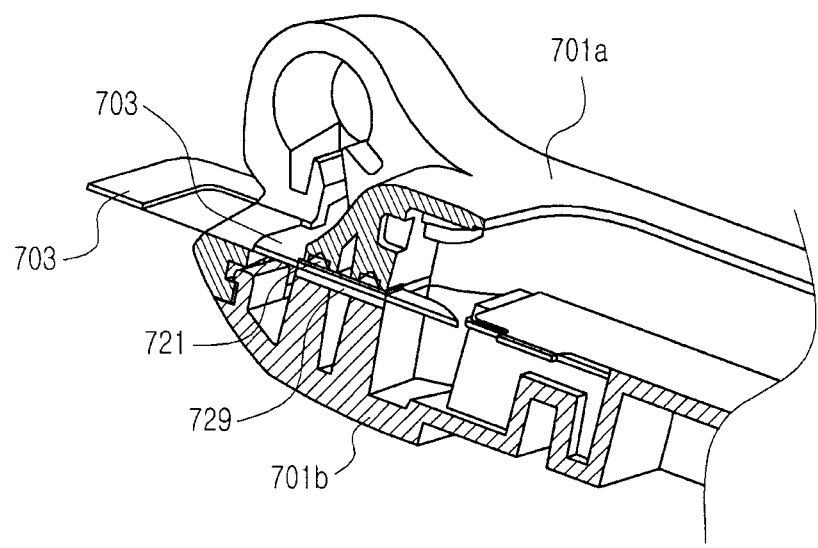
FIG. 28 is a perspective view cut away from the waterproof structure for the portable terminal shown in FIGS. 26 and 27.
Figure 29:
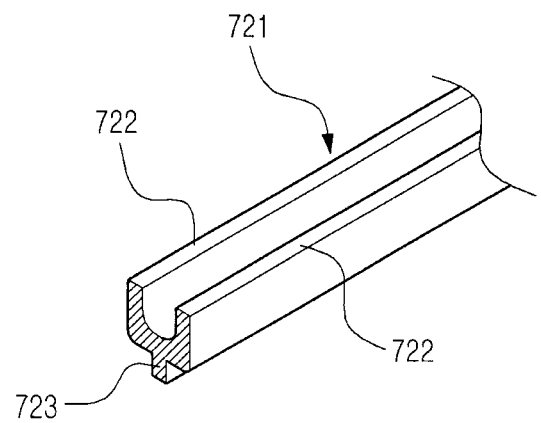
FIG. 29 is a view showing a cross-sectional structure of a gasket forming in part the waterproof structure for the portable terminal shown in FIG. 26.

FIGS. 26 and 27 show the front case and the rear case forming a main housing of a folder-type terminal, and FIG. 28 shows a coupled state of the front case and the rear case shown in FIGS. 26 and 27. The main housing is provided with circuit devices providing a communication function and a storage device, and the front case is provided with a keypad. As mentioned previously, a waterproof member for providing a waterproof function is positioned between the front case and the rear case, thereby implementing the waterproof structure.

The front case is provided with a partition wall formed on an inner surface thereof, thereby providing a receiving space for receiving a circuit unit such as a circuit device or a storage device. A recess is formed in a top end of the partition wall to provide a space allowing installation of a part of the waterproof member. Another partition wall corresponding to the partition wall of the front case is formed on an inner surface of the rear case. The partition walls of the front case and the rear case are engaged with each other, thereby forming the receiving space for receiving the circuit unit.

The waterproof member may include a first waterproof member installed on a top end portion of the partition wall formed on the front case and a second waterproof member installed on the partition wall formed on the rear case. A flexible printed circuit which connects the main housing including the front case and the rear case with a sub housing coupled to the main housing is wired between the first waterproof member and the second waterproof member. At least on the partition wall of the front case is formed a wiring hole for providing a space allowing passage of the flexible printed circuit therethrough. The wiring hole is connected with the recess formed in the top end of the partition wall.

The first waterproof member may include a gasket formed of an elastic material such as silicone or urethane, and is in a closed curve shape extending along the top end of the partition wall of the front case. The first waterproof member has another closed curve shape portion 725, or a sealing portion, in a position corresponding to the wiring hole, thereby providing a double waterproof structure. The flexible printed circuit is wired from inside the housing to outside the housing, and passing through the sealing portion. In a portion corresponding to the flexible printed circuit on the sealing portion, a recess for receiving the flexible printed circuit may be formed.

A pair of first ribs is formed on a rear surface of the first waterproof member, that is, on a portion facing the rear case. In other words, the first waterproof member includes at least one pair of ribs formed on an outer circumferential surface thereof. The first ribs closely contact to the rear case, more specifically, the top end portion of the partition wall formed on the rear case, thereby providing a stable waterproof structure. Likewise, a second rib is formed on a front surface of the first waterproof member, that is, on a portion facing the front case in such a way that the second rib closely contacts to the partition wall of the front case, thereby providing the stable waterproof structure. Since the recess for receiving the first waterproof member is formed in the front case, it may not be necessary to form the second rib if the outer circumferential surface of the first waterproof member can closely contact to the recess.

It can be easily understood by those of ordinary skill in the art that the partition wall has to be formed to support the sealing portion of the first waterproof member.

In this way, by forming the sealing structure between the front case and the flexible printed circuit, a waterproof function can be provided.

Moreover, the second waterproof member forming the remaining part of the waterproof member is provided between the rear case and the flexible printed circuit.

The second waterproof member is preferably formed of an elastic material such as, for example, sponge, rubber, silicone, or urethane. Thus, the waterproof structure is provided by the first waterproof member between the rear case and the rear case, and the waterproof structure is provided by the first waterproof member and the second waterproof member in the wiring path of the flexible printed circuit.

The waterproof structure for the portable terminal structured as described above can be easily manufactured by merely disposing the first waterproof member and the second waterproof member in a process of assembling the front case and the rear case.

As is apparent from the foregoing description, in a waterproof structure for a portable terminal according to the present invention, a waterproof member is provided between a housing of the portable terminal and a flexible printed circuit which is inserted from outside into or withdrawn to outside from the housing, thereby improving the waterproof function of the portable terminal. In this way, moisture or water is prevented from being introduced into the housing of the terminal, thereby improving the reliability of the portable terminal.

While the present invention has been shown and described with reference to exemplary embodiments thereof, it will be understood by those skilled in the art that various changes in form and details may be made therein without departing from the spirit and scope of the invention as defined by the appended claims.

What is claimed is:

1. A waterproof structure for a portable terminal comprising at least a first housing and a second housing, comprising:
 a flexible printed circuit extending from an inside to an outside of the first housing and extending into and contained within an inside of the second housing;
 a first and a second wiring hole formed in the first and the second housings respectively for providing a path in which the flexible printed circuit passes therethrough;
 a first and a second partition wall formed respectively inside the first housing and the second housing; and
 a first and second protrusion extending respectively from a surface of the first partition wall and the second partition wall,
 wherein the first wiring hole is formed to penetrate the first protrusion and the second wiring hole is formed to penetrate the second protrusion; and
 a first and a second waterproof member provided in the first and the second wiring hole respectively to have substantial contact with at least inner walls of each of the first housing and the second housing and an outer circumferential surface of the flexible printed circuit so that said flexible printed circuit is held in place by the first and second waterproof member, wherein each of the first waterproof member and the second waterproof member comprises:
  a body portion substantially contacting an outer end of the first protrusion of the first partition wall and the second protrusion of the second partition wall, respectively; and
  a waterproof portion extending from the body portion to the inside of the first wiring hole and the second wiring hole, respectively,
 wherein the flexible printed circuit is wired through the waterproof portion, wherein the body portion is comprised of a rigid synthetic resin, and wherein the waterproof portion is comprised of an elastic material, and a slit penetrating the waterproof portion from the body portion allows the passage of the flexible printed circuit therethrough; and
 wherein an outer circumferential surface of each of the first waterproof member and the second waterproof member substantially contacts a circumference of an inlet of the first wiring hole or the second wiring hole or an inner wall of the first wiring hole or the second wiring hole to form a first and a second waterproof seal.

2. The waterproof structure of claim 1, further comprising:
 a first receiving partition wall and a second receiving partition wall formed in each of the first housing and the second housings, respectively;
 a first receiving recess and a second receiving recess surrounded by each of the first receiving partition wall and the second receiving partition wall, respectively; and
 a first through-hole and a second through-hole extending from the first receiving recess and the second receiving recess and communicating with the outside of each the first housing and the second housings, respectively, through the first receiving partition wall and the second receiving partition wall, respectively;
 wherein the first wiring hole and the second wiring hole extends from the first receiving recess and second receiving recess to the inside of each of the first housing and second housing, respectively, through the first receiving partition wall and the second receiving partition wall facing the first through hole and second through-hole, respectively, and is disposed on a substantially straight line with respect to the first through-hole and the second through-hole, respectively.

3. The waterproof structure of claim 2, wherein each of the first waterproof member and the second waterproof member comprises a first sealing member and a second sealing member which are arranged in the first and second receiving recess and face each other, respectively, the first sealing member and the second sealing member substantially contacting upper and lower surfaces of the flexible printed circuit to form the first and the second waterproof seals, respectively.

4. The waterproof structure of claim 3, further comprising a first clamp and a second clamp fixed to each of the first housing and the second housings respectively, wherein the first sealing member and the second sealing member are pressed against the upper and the lower surfaces of the flexible printed circuit when the clamp is fixed to the first housing and the second housings.

5. The waterproof structure of claim 3, wherein at least one of the first sealing member and the second sealing member is integrally formed with a respective one of the first housing and second housings by double injection molding.

6. The waterproof structure of claim 1, further comprising at least one sealing protrusion formed on an outer circumferential surface of the first waterproof portion or the second waterproof portion, wherein the at least one sealing protrusion extends along the outer circumference of the first waterproof portion or the second waterproof portion, and an end portion thereof contacting the inner wall of the first wiring hole or the second wiring hole.

7. The waterproof structure of claim 6, wherein said at least one sealing protrusion comprises a first sealing protrusion and a second sealing protrusion formed on an inner circumferential surface of the first waterproof portion or the second waterproof portion, wherein the second sealing protrusion component is formed in a position corresponding to the first sealing protrusion component, an end portion of the first sealing protrusion and the second sealing protrusion are substantially contacting the flexible printed circuit to form a waterproof seal.

8. The waterproof structure of claim 1, wherein each of the first waterproof member and the second waterproof member further comprises a first engagement piece and a second engagement piece extending from a first side end and a second side end of the body portion respectively, the first engagement piece being fixed to the inner surface of the first housing and the second engagement piece being fixed to the inner surface of the second housing.

9. A waterproof structure for a portable terminal comprising a first housing and a second housing, comprising:
   a flexible printed circuit extending from an inside to an outside of the first housing and extending into and contained within an inside of the second housing;
   a first wiring hole and a second wiring hole formed in the first housing and the second housing respectively for providing a path in which the flexible printed circuit passes therethrough; and
   a first waterproof member provided in the first wiring hole and a second waterproof member provided in the second wiring hole to have substantial contact with at least inner walls of each of the first housing and the second housing, respectively, and an outer circumferential surface of the flexible printed circuit so that said flexible printed circuit is held in place by the first waterproof member and the second waterproof member,
   wherein an outer circumferential surface of the first waterproof member and the second waterproof member substantially contacts a circumference of an inlet of the first wiring hole and second wiring hole or an inner wall of the first wiring hole or the second wiring hole to form a first waterproof seal and a second waterproof seal, respectively; and
   wherein each of the first wiring hole and the second wiring hole is a through hole extending from the outside of the first housing and the second housing to the inside of the first housing and the second housing, respectively,
   wherein each of the first waterproof member and the second waterproof member comprises (a) a first coupling member and a second coupling member disposed in the first wiring hole and the second wiring hole, respectively, made of rigid synthetic resin; and (b) a first sealing member and a second sealing member adhered to inner surfaces of each of the first coupling member and the second coupling member, respectively, and
   wherein as each of the first coupling member and the second coupling member are coupled in each of the first wiring hole and the second wiring hole, facing each other, and the first sealing member and the second sealing member substantially contact one of the upper and lower surfaces of the flexible printed circuit, respectively.

10. The waterproof structure of claim 9, wherein each of the first waterproof member and the second waterproof member substantially contacts the inner wall of the first wiring hole and the second wiring hole, and the first sealing member and the second sealing member surrounds the outer surfaces of the first coupling member and the second coupling member respectively.

11. The waterproof structure of claim 9, wherein both end portions of the first coupling member and the second coupling member of the first waterproof member and the second water proof member are bent to face each other, and fusion protrusions are formed at both bent end portions of the first coupling member of the first and second waterproof members, and wherein a pair of fusion grooves are formed respectively at both bent end portions of the second coupling member of the first and second water proof members, and the fusion protrusions of the first coupling member are adhered into the fusion grooves of the second coupling member of the respective first or second waterproof member by ultrasonic fusion.

12. A waterproof structure for a portable terminal comprising a first housing and a second housing, comprising:
   a flexible printed circuit extending from an inside to an outside of the first housing and extending into and contained within an inside of the second housing;
   a first and a second wiring hole formed in each of the first and the second housing respectively for providing a path in which the flexible printed circuit passes therethrough; and
   a first waterproof member and a second waterproof member provided in the first wiring hole and in the second wiring hole, respectively, to have substantial contact with at least inner walls of each of the first housing and the second housing and an outer circumferential surface of the flexible printed circuit so that said flexible printed circuit is held in place by the first waterproof member and the second waterproof member, respectively, wherein an outer circumferential surface of each of the first waterproof member and the second waterproof member substantially contacts a circumference of an inlet of the first wiring hole or the second wiring hole or an inner wall of the first wiring hole or the second wiring hole to form a first waterproof seal and a second waterproof seal of the waterproof structure, wherein the first waterproof member comprises a hollow formed therein, and the second waterproof member comprises a protrusion formed on a surface thereof, the protrusion pressing a surface of the flexible printed circuit across the flexible printed circuit, thereby making the flexible printed circuit come into contact to the first waterproof member, the waterproof structure further comprising;
   a plurality of binding grooves formed on both side walls of a receiving recess of the first housing and the second housing; and
   a first binding protrusion and a second binding protrusion, each formed at both side ends of the first waterproof member and the second waterproof member, respectively,
   wherein each of the first binding protrusions and the second binding protrusions are engaged with the binding grooves of the respective housing such that the first waterproof member and the second waterproof member are fixed into the receiving recess of the respective housing.

13. The waterproof structure of claim 12, wherein the first waterproof member and the second waterproof member are each comprised of elastic materials.

14. The waterproof structure of claim 1, wherein the first housing and the second housing comprises a front case and a rear case that are coupled to face each other, and the first waterproof member and the second waterproof member comprises a first waterproof member seal which is provided on the front case of the respective housing and substantially contacts a surface of the flexible printed circuit and a second waterproof member seal that is provided on the rear case of the respective housing and substantially contacts another surface of the flexible printed circuit.

15. The waterproof structure of claim 14, wherein the first waterproof member seal comprises a gasket formed of silicone or urethane and is positioned on a top end portion of the partition wall that is provided on the front case to receive a circuit unit.

16. The waterproof structure of claim 15, wherein the top end of the first partition wall and the second partition wall of the front case of the respective housing comprises a recess for receiving the gasket.

17. The waterproof structure of claim 14, wherein the first waterproof member seal on the first housing and the second waterproof member seal on the second housing each comprises a gasket formed of silicone or urethane and each includes ribs on an outer circumferential surface thereof, the ribs substantially contacting the rear case of the respective housing.

18. The waterproof structure of claim 14, wherein the first waterproof member seal comprises a sealing portion in a closed curve shape on the first wiring hole, and the flexible printed circuit is wired from an inside to an outside of the first housing, passing through the sealing portion.

19. The waterproof structure of claim 18, wherein the sealing portion is provided with a recess for receiving a portion of the flexible printed circuit.

20. The waterproof structure of claim 18, wherein the second waterproof member seal is positioned to face the sealing portion having the flexible printed circuit therebetween.

21. The waterproof structure of claim 14, wherein the second waterproof member seal is manufactured from one of sponge, rubber, silicone, and urethane.

* * * * *